(12) United States Patent
Luthwaite et al.

(10) Patent No.: US 12,160,964 B2
(45) Date of Patent: *Dec. 3, 2024

(54) ELECTRONIC VISUAL DISPLAY PANELS FOR PRESENTING VISUAL DATA

(71) Applicant: Sphere Entertainment Group, LLC, New York, NY (US)

(72) Inventors: Alex Luthwaite, Lancaster, PA (US); Miguel Fontgivell Ariño, Saragossa (ES)

(73) Assignee: Sphere Entertainment Group, LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/505,393

(22) Filed: Nov. 9, 2023

(65) Prior Publication Data

US 2024/0155787 A1    May 9, 2024

Related U.S. Application Data

(63) Continuation of application No. 17/515,193, filed on Oct. 29, 2021, now Pat. No. 11,825,618.

(Continued)

(51) Int. Cl.
*H05K 5/02* (2006.01)
*F16B 2/02* (2006.01)
(Continued)

(52) U.S. Cl.
CPC ............. *H05K 5/0217* (2013.01); *F16B 2/02* (2013.01); *G09F 9/3026* (2013.01); *G09F 9/33* (2013.01);
(Continued)

(58) Field of Classification Search
CPC ... H05K 5/0017; H05K 5/0021; H05K 5/0217
(Continued)

(56) References Cited

U.S. PATENT DOCUMENTS

| 5,724,775 A | 3/1998 | Zobel et al. |
| 5,900,850 A | 5/1999 | Bailey et al. |

(Continued)

OTHER PUBLICATIONS

International Search Report and Written Opinion of the International Searching Authority directed to related International Patent Application No. PCT/US2021/060043, mailed Feb. 8, 2022; 13 pages.

*Primary Examiner* — Hung S. Bui
(74) *Attorney, Agent, or Firm* — Sterne, Kessler, Goldstein & Fox P.L.L.C.

(57) ABSTRACT

An exterior display system can be configured and arranged around a structure. The exterior display system includes a mechanical supporting structure configured and arranged about the exterior surface of the structure. This mechanical supporting structure can include various supporting structures and/or mounting structures which are configured and arranged to form a mechanical lattice framework. An electronic visual display device can be connected to the mechanical lattice framework to form the exterior display system. The electronic visual display device can include multiple electronic visual display panels which are connected to the mechanical lattice framework. Each of these multiple electronic visual display panels can include multiple groups of multiple light-emitting diodes (LEDs), also referred to electronic LED disc assemblies, that are configured and arranged in a series of one or more rows and/or a series of one or more columns.

20 Claims, 20 Drawing Sheets

Related U.S. Application Data

(60) Provisional application No. 63/162,318, filed on Mar. 17, 2021, provisional application No. 63/117,829, filed on Nov. 24, 2020.

(51) Int. Cl.
    *G09F 9/302*    (2006.01)
    *G09F 9/33*     (2006.01)
    *G09F 11/10*    (2006.01)
    *G09F 13/00*    (2006.01)
    *G09F 13/04*    (2006.01)
    *G09F 19/02*    (2006.01)
    *G09G 3/32*     (2016.01)
    *H05K 5/00*     (2006.01)

(52) U.S. Cl.
    CPC ............ *G09F 11/10* (2013.01); *G09F 13/005* (2013.01); *G09F 13/0448* (2021.05); *G09F 19/02* (2013.01); *G09G 3/32* (2013.01); *H05K 5/0021* (2013.01); *G09G 2300/026* (2013.01); *G09G 2330/02* (2013.01); *G09G 2370/10* (2013.01)

(58) Field of Classification Search
    USPC ......................................................... 361/731
    See application file for complete search history.

(56) References Cited

U.S. PATENT DOCUMENTS

| | | |
|---|---|---|
| 5,918,438 A | 7/1999 | South |
| 7,173,649 B1 | 2/2007 | Shannon |
| 8,297,282 B2 | 10/2012 | Holley et al. |
| 8,766,880 B2 | 7/2014 | Kharrati et al. |
| 9,427,763 B2 | 8/2016 | Fuller et al. |
| 9,523,209 B2 | 12/2016 | de Lespinois et al. |
| D898,225 S | 10/2020 | Rossborough, Jr et al. |
| 10,914,062 B2 | 2/2021 | Dimitrov |
| 11,825,618 B2 * | 11/2023 | Luthwaite ................ G09G 3/32 |
| 11,844,182 B2 | 12/2023 | Luthwaite et al. |
| 11,985,776 B2 | 5/2024 | Luthwaite et al. |
| 2009/0128461 A1 | 5/2009 | Geldard et al. |
| 2009/0290076 A1 | 11/2009 | Tait et al. |
| 2010/0066563 A1 | 3/2010 | Harrington et al. |
| 2011/0134640 A1 | 6/2011 | Bertele |
| 2012/0044685 A1 | 2/2012 | Chen et al. |
| 2013/0167452 A1 | 7/2013 | Jacques et al. |
| 2014/0355266 A1 | 12/2014 | Hsue |
| 2015/0111654 A1 | 4/2015 | Fox et al. |
| 2015/0187241 A1 | 7/2015 | Hall |
| 2015/0226391 A1 | 8/2015 | Sellam |
| 2015/0243196 A1 | 8/2015 | Hall |
| 2018/0373482 A1 | 12/2018 | Park et al. |
| 2019/0333424 A1 | 10/2019 | Zhu et al. |
| 2020/0112543 A1 | 4/2020 | Weed et al. |
| 2021/0110741 A1 | 4/2021 | Gunneras et al. |
| 2021/0294198 A1 | 9/2021 | Krauthamer |
| 2021/0327314 A1 | 10/2021 | Sellam |
| 2022/0165185 A1 | 5/2022 | Luthwaite et al. |
| 2022/0165207 A1 | 5/2022 | Luthwaite et al. |
| 2022/0167513 A1 | 5/2022 | Luthwaite et al. |
| 2024/0155786 A1 | 5/2024 | Luthwaite et al. |

* cited by examiner

ELECTRONIC VISUAL DISPLAY PANELS FOR PRESENTING VISUAL DATA

CROSS-REFERENCE TO RELATED APPLICATIONS

The present application is a continuation of U.S. patent application Ser. No. 17/515,193, filed Oct. 29, 2021, now U.S. Pat. No. 11,825,618, which claims the benefit of U.S. Provisional Patent Application No. 63/117,829, filed Nov. 24, 2020, and U.S. Provisional Patent Application No. 63/162,318, filed Mar. 17, 2021, each of which is incorporated herein by reference in its entirety.

BACKGROUND

Large steel-framed signs, also referred to as billboards or billing boards, represent large outdoor advertising structures, that are typically found in high traffic areas, such as along various roadways and in many urban areas. Billboards can be effective for building brand awareness and broadcasting business, product, or campaign information to as many people as possible. The most common billboards can include bulletins and poster panels. Bulletins, which are the largest of these steel-framed signs, can be 20 feet high by 60 feet wide while poster panels are typically smaller. Other types of billboards, such as painted billboards, digital billboards, and even mobile billboards to provide examples, are available. These billboards are mounted on poles between 20 feet and 100 feet in height with these poles being placed alongside various roadways. Many urban areas have high densities of billboards, especially in the areas of high pedestrian traffic. Because space is often a premium in these urban areas, these billboards are typically placed on the sides of buildings and can sometimes be suspended above buildings.

BRIEF DESCRIPTION OF THE DRAWINGS/FIGURES

The accompanying drawings, which are incorporated herein and form a part of the specification, illustrate the present disclosure and, together with the description, further serve to explain the principles thereof and to enable a person skilled in the pertinent art to make and use the same.

FIG. 1 illustrates a perspective view of an exemplary exterior display system for displaying visual media according to some embodiments of the disclosure;

FIG. 2A through FIG. 2D graphically illustrate a simplified exemplary supporting structure that can be implemented within the exemplary exterior display system according to some embodiments of the disclosure;

FIG. 3A through FIG. 3C graphically illustrate a simplified exemplary electronic visual display device that can be implemented within the exemplary exterior display system according to some embodiments of the disclosure;

FIG. 4A and FIG. 4B graphically illustrate an adjustable mechanical mounting assembly that can be utilized to connect electronic visual display panels to the exemplary supporting structure according to some embodiments of the disclosure;

FIG. 5A through FIG. 5C graphically illustrate various exemplary electronic visual display panels that can be implemented within the exemplary electronic visual display device according to some embodiments of the disclosure;

FIG. 6 graphically illustrates an exemplary row of electronic LED disc assemblies that can be implemented within the electronic visual display panels according to some embodiments of the disclosure;

FIG. 7 graphically illustrates an exemplary electronic LED disc module that can be included within the exemplary row of electronic LED disc assemblies according to some embodiments of the disclosure;

FIG. 8 illustrates a flowchart of an exemplary operation for constructing the exemplary exterior display system according to some embodiments of the disclosure;

FIG. 9 graphically illustrates a perspective view of an exemplary embodiment of the exemplary exterior display system according to some embodiments of the disclosure;

Figure 12:
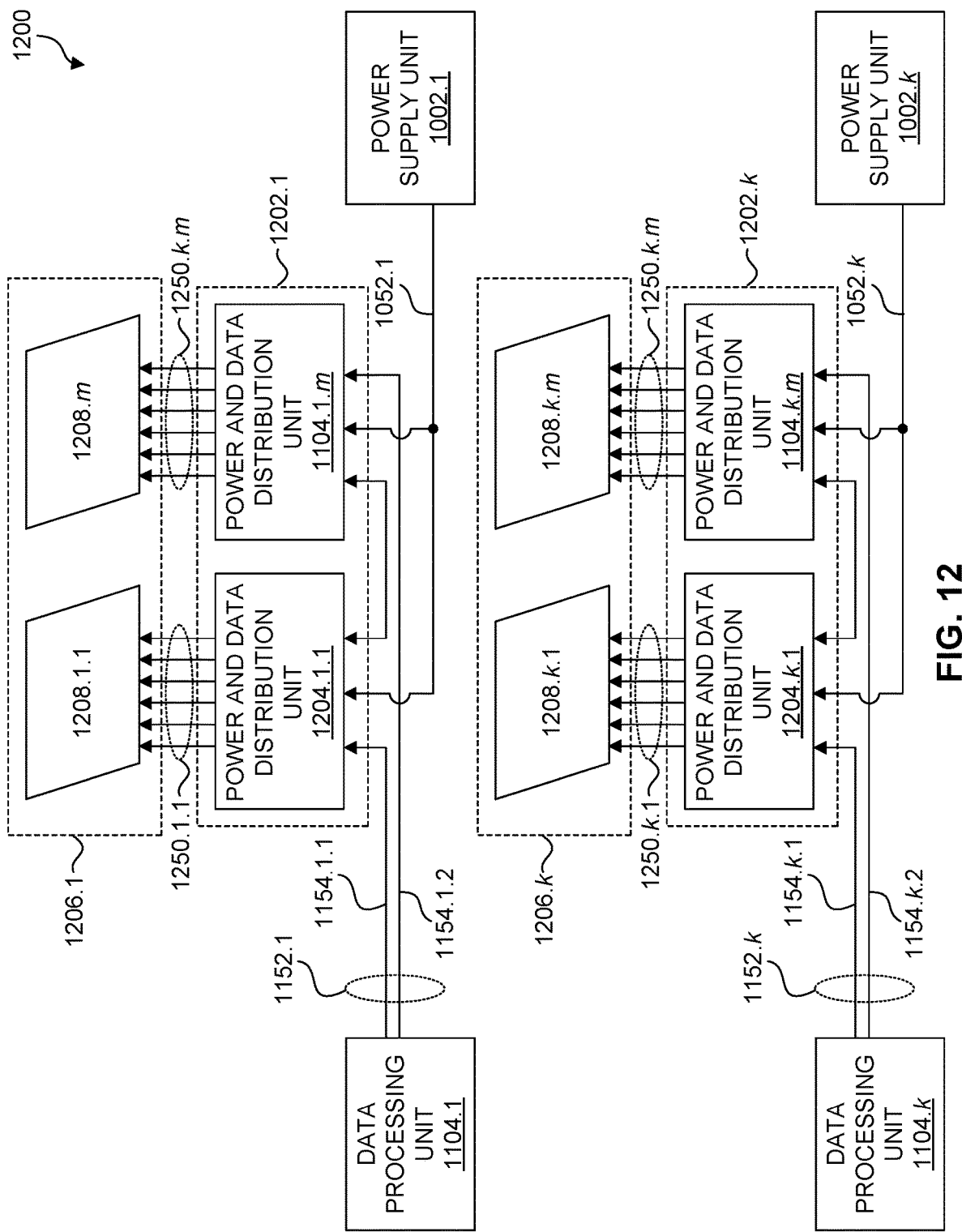
Figure 13:
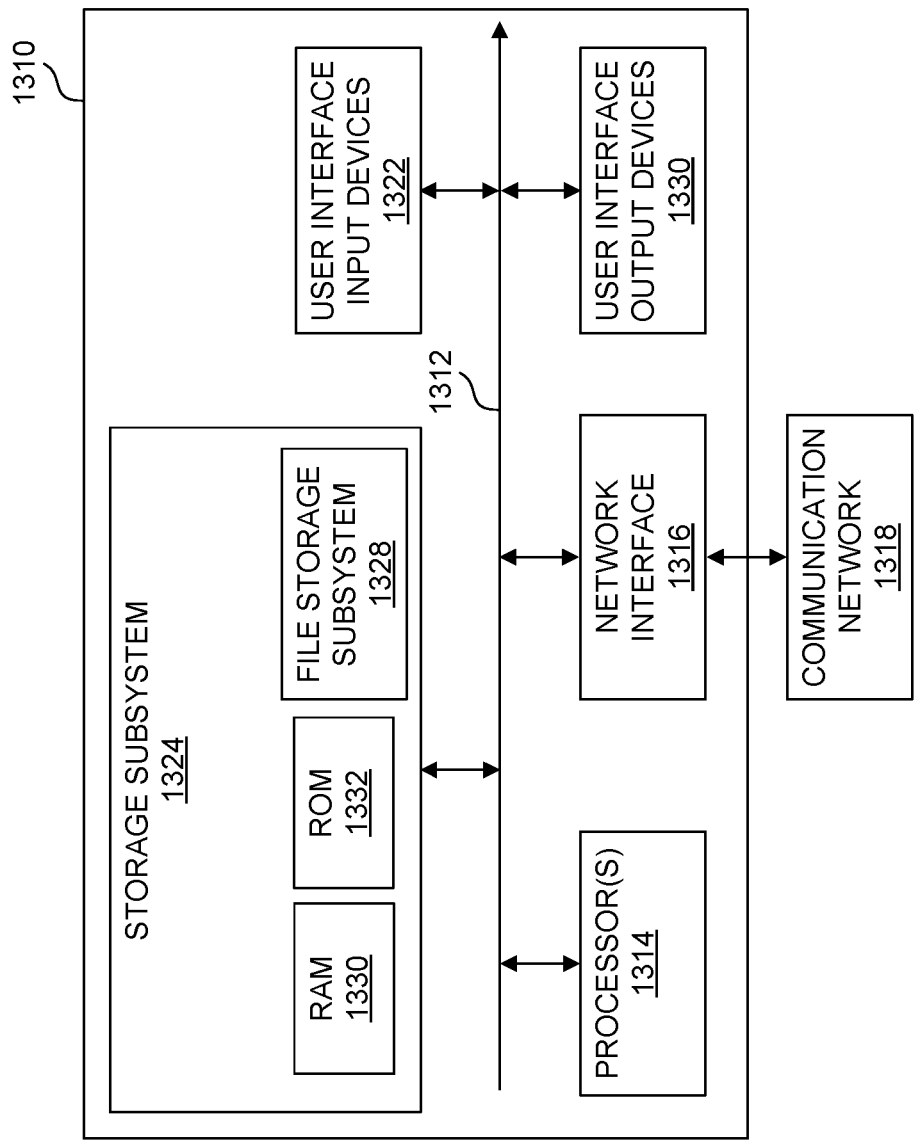

FIG. 12 illustrates a block diagram of a hierarchal power and data distribution system that can be implemented within the exemplary exterior display system according to some embodiments of the disclosure; and FIG. 13 graphically illustrates a simplified block diagram of a computer system suitable for use with embodiments described herein according to some exemplary embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the examples. This repetition does not in itself dictate a relationship between the embodiments and/or configurations discussed.

OVERVIEW

The detailed description to follow is to describe an exterior display system that is configured and arranged around a structure. As to be described in further detail below, the exterior display system includes a mechanical supporting structure configured and arranged about the exterior surface of the structure. This mechanical supporting structure can include various supporting structures and/or mounting structures which are configured and arranged to form a mechanical lattice framework. As to be described in further detail below, an electronic visual display device can be connected to the mechanical lattice framework to form the exterior display system. The electronic visual display device can include multiple electronic visual display panels which are connected to the mechanical lattice framework. Each of these multiple electronic visual display panels can include multiple groups of multiple light-emitting diodes (LEDs), also referred to electronic LED disc assemblies, that are configured and arranged in a series of one or more rows and/or a series of one or more columns.

The detailed description to follow is to describe various exemplary embodiments of the exterior display system having various supporting structures, various mounting structures, various assemblies, and the like. In some embodiments, the various mounting structures, the various assemblies, and the like can be implemented using one or more metallic elements, for example, copper, aluminum, one or more metallic compounds, and/or one or more metallic mixtures, or alloys, such as steel to provide an example. In some embodiments, the various mounting structures, the various assemblies, and the like can be implemented using one or more synthetic or semi-synthetic organic compounds or materials, also referred to as plastic, one or more organic materials, such as wood to provide an example, and/or any other suitable non-metallic material that will be apparent to those skilled in the relevant art(s) without departing from the spirit and scope of the present disclosure. In some embodiments, the various mounting structures, the various assemblies, and the like can have cross-sectional areas which can be round, circular, rectangular, square, and/or hexagonal, and/or any other suitable shape that will be apparent to those skilled in the relevant art(s) without departing from the spirit and scope of the present disclosure. Generally, this other suitable shape can represent any suitable regular geometric shape and/or irregular geometric shape that will be apparent to those skilled in the relevant art(s) without departing from the spirit and scope of the present disclosure. In some embodiments, the various mounting structures, the various assemblies, and the like can be solid and/or hollow.

In some embodiments, the various supporting structures, the various mounting structures, the various assemblies, and the like can be described as being connected to one another. In some embodiments, the various supporting structures, the various mounting structures, the various assemblies, and the like can be connected to one another using various fasteners, such as nuts, screws, bolts, rivets, pins, and/or lags to provide some examples. In some embodiments, the various supporting structures, the various mounting structures, the various assemblies, and the like can be connected to one another using a fabrication process, such as welding to provide an example, which connects the various supporting structures, the various mounting structures, the various assemblies, and the like. In some embodiments, the various supporting structures, the various mounting structures, the various assemblies, and the like can be configured and arranged to form various interlocking connectors, such as annular snap-together connectors, cantilever snap-together connectors, torsional snap-together connectors, and the like to provide some examples, which are connected to one another by pushing the various mounting structures, the various assemblies, and the like into one another.

EXEMPLARY EXTERIOR DISPLAY SYSTEM

Figure 1:
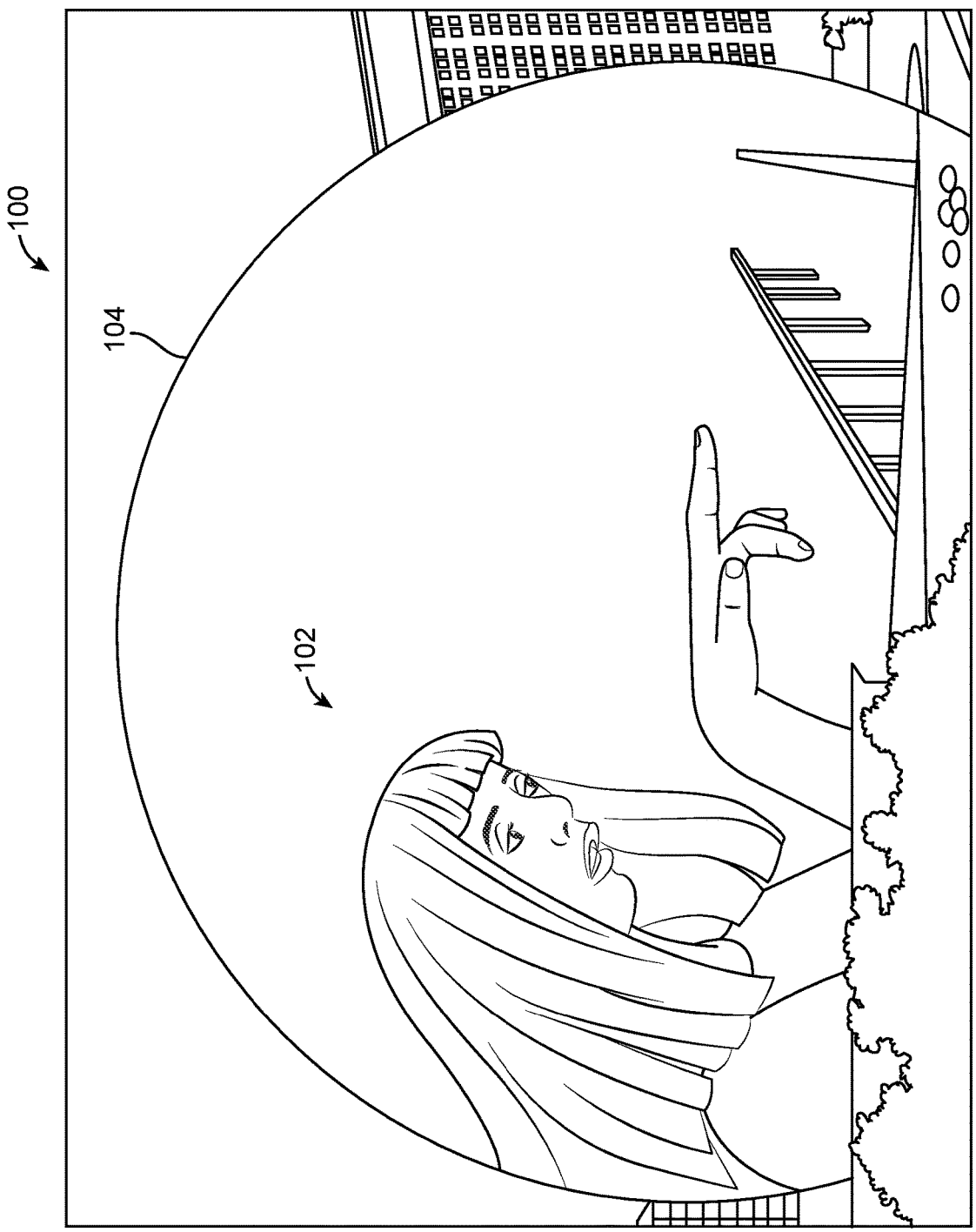

FIG. 1 illustrates a perspective view of an exemplary exterior display system for displaying visual media according to some embodiments of the disclosure. In the exemplary embodiment illustrated in FIG. 1, an exterior display system 100 can be configured and arranged to present visual media 102, such as images, pictures, graphics, informational content, live images, moving images, videos, animations, advertisements, promotional content, movies, scenery, light displays and effects, among others. In some embodiments, the exterior display system 100 can include an electronic visual display device 104 that is configured and arranged around a building structure and/or a nonbuilding structure, or a portion of the exterior surface of the building structure and/or the nonbuilding structure. For example, the electronic visual display device 104 can be configured and arranged around an exterior surface of a building structure and/or a nonbuilding structure, or a portion of the exterior surface of the building structure and/or the nonbuilding structure. For convenience, the building structure and/or the nonbuilding structure is not illustrated in FIG. 1.

Generally, the building structure refers to any suitable structure, or structures, that are designed for human occupancy and can include one or more residential, industrial, and/or commercial building structures. The residential building structure can include a single-family detached home, a single-family connected home, and/or a large multi-family home. The commercial building structure can include an office building structure, a non-freestanding retail building structure, also referred to as a shopping mall, a free-standing retail building structure, a hotel building structure, and/or a special purpose commercial building structure such as a self-storage building structure, a theme or an amusement building structure, and/or a theater building structure. The industrial building structure can include a manufacturing building structure, a warehouse/distribution building structure, and/or a flex space building structure, such as an office building, a laboratory, a data center, a call center and/or a showroom. The residential, industrial, and/or commercial building structures can further include specialty building structures, such as educational building structures, such as elementary schools, secondary schools, colleges, or universities; civic building structures, such as arenas, libraries, museums, or community halls; religious building structures, such as churches, mosques, shrines, temples, or synagogues; government building structures, such as city halls, courthouses, fire stations, police stations, or post offices; military building structures; and/or transport building structures, such as airport terminals, bus stations, or subway stations. Generally, the nonbuilding structure refers to any suitable structure, or structures, that are not designed for human occupancy and can include one or more residential, industrial, and/or commercial nonbuilding structures. The one or more residential, industrial, and/or commercial nonbuilding structures can include aqueducts, bridges and bridge-like structures, canals, communications towers, dams, monuments, roads, signage, and/or tunnels to provide some examples.

In the exemplary embodiment illustrated in FIG. 1, the building structure and/or the nonbuilding structure can include, be connected to, and/or be surrounded by a mechanical supporting structure configured and arranged about its exterior surface or a portion of its exterior surface. The mechanical supporting structure can be characterized as providing a mechanical lattice framework for forming the electronic visual display device 104. As to be described in further detail below, the electronic visual display device 104 can be implemented using multiple electronic visual display panels. Each of these multiple electronic visual display panels can include one or more interconnected modular electronic visual display panels having multiple groups of multiple light-emitting diodes (LEDs), also referred to as electronic LED disc assemblies, that are configured and arranged in a series of one or more rows and/or a series of one or more columns. In some embodiments, each electronic LED disc assembly can be characterized as forming a pixel of the electronic visual display device 104. In some embodiments, the electronic visual display device 104 can include 200,000 to 2,000,000 electronic LED disc assemblies, 500,000 to 1,500,000 electronic LED disc assemblies, or 750,000 to 1,250,000 electronic LED disc assemblies which equates to 200,000 to 2,000,000 pixels, 500,000 to 1,500,000 pixels, or 750,000 to 1,250,000 pixels. In some embodiments, a maximum brightness of the electronic visual display device 104 can be in a range of 4,000 nits/ft$^2$ to 6,000 ft$^2$, 4,500 nits/ft$^2$ to 5,500 nits/ft$^2$, or 4,800 nits/ft$^2$ to 5,200 nits/ft$^2$ to ensure that the electronic visual display device 104 is visible during periods of bright sunlight.

As to be described in further detail below, the multiple electronic visual display panels can be connected to the mechanical supporting structure to form the electronic visual display device 104. In some embodiments, the mechanical supporting structure can be configured and arranged to effectively shape the electronic visual display device 104 to be spherical, or spherical-like, in shape as illustrated in FIG. 1. However, those skilled in the relevant art(s) will recognize that the mechanical supporting structure can be configured and arranged differently to cause the electronic visual display device 104 to be any suitable three-dimensional shape, or shape, without departing from the spirit and scope of the present disclosure. This suitable three-dimensional shape, or shape, can include a cube, a rectangular prism, a cone, a cylinder, and/or any combination thereof to provide some examples. In some embodiments, the electronic visual display device 104 can have a substantially similar shape as the building structure and/or the nonbuilding structure. For example, the mechanical supporting structure can be connected to a building structure and/or nonbuilding structure having a spherical, or spherical-like, shape. In this example, the mechanical supporting structure can be configured and arranged to effectively shape the electronic visual display device 104 to be similarly spherical, or spherical-like, in shape as the building structure and/or the nonbuilding structure. In some embodiments, the electronic visual display device 104 can have a different shape than the building structure and/or the nonbuilding structure. For example, the mechanical supporting structure can surround a building structure and/or nonbuilding structure having a rectangular prism, or rectangular prism-like, shape. In this example, the mechanical supporting structure can be configured and arranged to effectively shape the electronic visual display device 104 to be spherical, or spherical-like, in shape which is different from the shape of the building structure and/or the nonbuilding structure.

Exemplary Mechanical Supporting Structure of the Exterior Display System

Figure 2A:
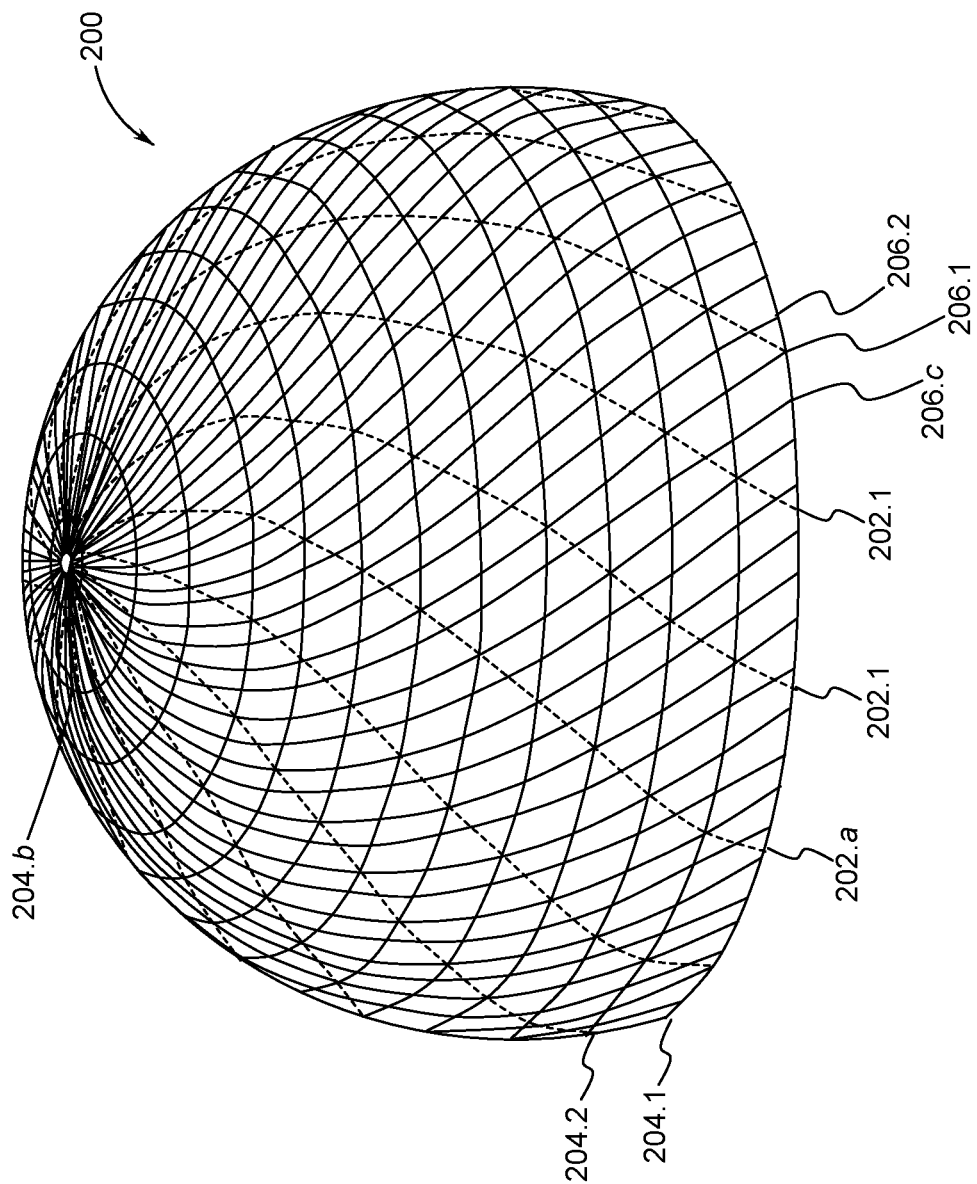

FIG. 2A through FIG. 2D graphically illustrate a simplified exemplary supporting structure that can be implemented within the exemplary exterior display system according to some embodiments of the disclosure. As described above, the exterior display system 100 can include a mechanical supporting structure, such as a mechanical supporting structure 200 as illustrated in FIG. 2A, that is configured and arranged around a building structure and/or a nonbuilding structure. Although FIG. 2A through FIG. 2D illustrate the mechanical supporting structure 200 as having a spherical, or spherical-like, shape, this is for illustrative purposes only. Those skilled in the relevant art(s) will recognize that the mechanical supporting structure 200 can have another shape, such as a cube, a rectangular prism, a cone, a cylinder, and/or any combination thereof to provide some examples, without departing from the spirit and scope of the present disclosure. As to be described in further detail below, the electronic visual display device 104 can include multiple electronic visual display panels which can be connected to the mechanical supporting structure 200 to form the exterior display system 100. As illustrated in FIG. 2A through FIG. 2D, the mechanical supporting structure 200 can include vertical supporting structures 202.1 through 202.a, horizontal supporting structures 204.1 through 204.b, vertical mounting structures 206.1 through 206.c, and/or any combination thereof.

In the exemplary embodiment illustrated in FIG. 2A through FIG. 2D, the mechanical supporting structure 200 can be characterized as providing a mechanical lattice framework to connect the multiple electronic visual display panels to the mechanical supporting structure 200. This mechanical lattice can be characterized as providing a strong and stable framework for the electronic visual display device 104 to dissipate forces exerted on the electronic visual display device 104 by wind, precipitation, and other environmental effects to provide some examples. As illustrated in FIG. 2A, the vertical supporting structures 202.1 through 202.a are connected to the horizontal supporting structures 204.1 through 204.b to form a mechanical skeleton framework with the vertical mounting structures 206.1 through 206.c being connected to this mechanical skeleton framework to form the mechanical supporting structure 200. Exemplary embodiments of the vertical supporting structures 202.1 through 202.a, the horizontal supporting structures 204.1 through 204.b, and the vertical mounting structures 206.1 through 206.c are to be described in further detail below in FIG. 2B through FIG. 2D.

Figure 2C:
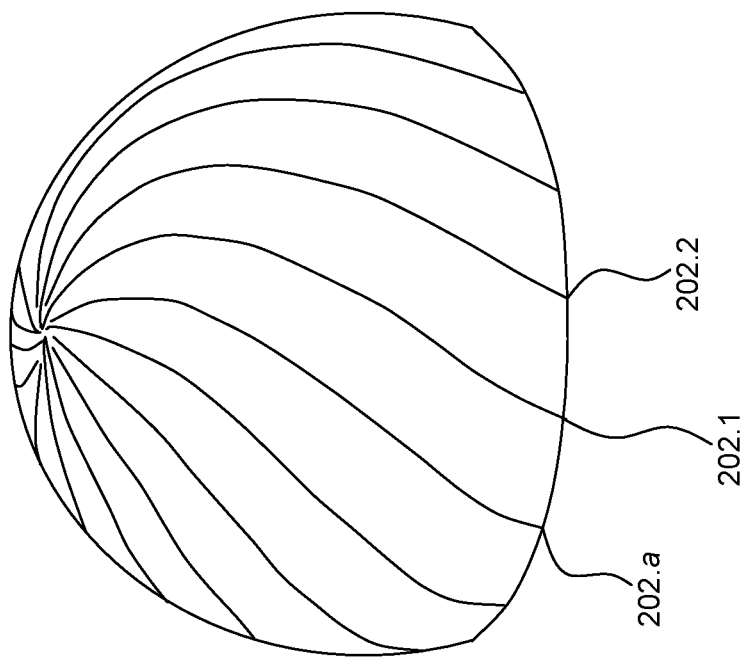
Figure 2B:
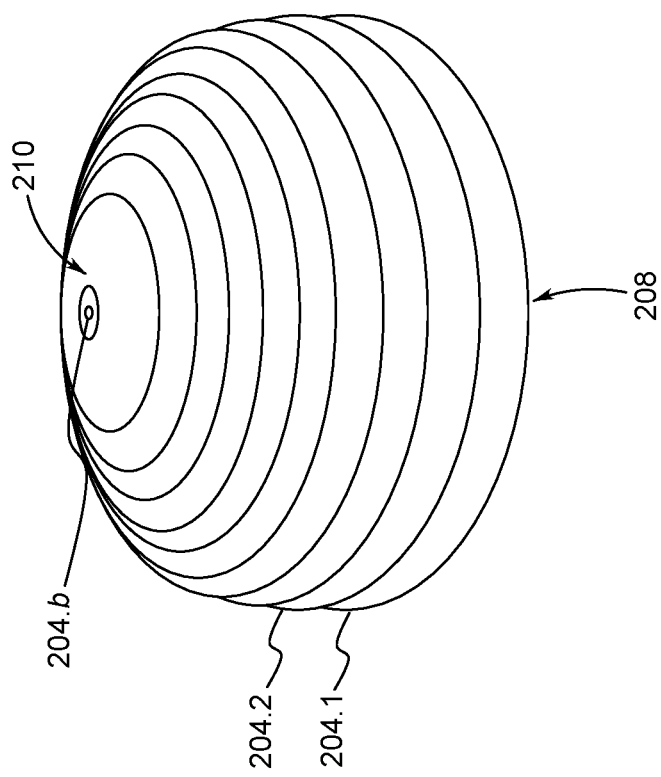

In the exemplary embodiment illustrated in FIG. 2B, the horizontal supporting structures 204.1 through 204.b can be characterized as being horizontal, or longitudinal, supporting structures. In the exemplary embodiment illustrated in FIG. 2B, the configuration and arrangement of the horizontal supporting structures 204.1 through 204.b can be characterized as determining the shape of the mechanical supporting structure 200, such as, approximating a portion of a sphere, for example, a hemisphere, also referred to as a dome, as illustrated in FIG. 2A. As illustrated in FIG. 2B, the horizontal supporting structures 204.1 through 204.b traverse in horizontal directions for example, parallel to different x-y planes of a Cartesian coordinate system. The horizontal supporting structures 204.1 through 204.b can be characterized as being concentric two-dimensional geometric shapes, for example, circles as illustrated in FIG. 2B, which are situated on the different parallel x-y planes of the Cartesian coordinate system. The different parallel x-y planes of the Cartesian coordinate system can traverse from a base 208, or bottom, of the mechanical supporting structure 200 to an apex 210, or top, of the mechanical supporting structure 200. Those horizontal supporting structures from among the horizontal supporting structures 204.1 through 204.b which are closer in distance toward the base 208 of the mechanical supporting structure 200 can be characterized as having a greater radius, diameter, and/or circumference than those horizontal supporting structures from among the horizontal supporting structures 204.1 through 204.b which are further in distance from the base 208 to form the portion of the sphere, for example, the dome as illustrated in FIG. 2A.

In the exemplary embodiment illustrated in FIG. 2C, the vertical supporting structures 202.1 through 202.a can be characterized as being vertical, or latitudinal, supporting structures. For convenience, the vertical supporting structures 202.1 through 202.a are indexed counterclockwise from 1 to a in FIG. 2C. The vertical supporting structures 202.1 through 202.a as illustrated in FIG. 2C can be connected to the horizontal supporting structures 204.1 through 204.b as illustrated in FIG. 2B above to form the mechanical skeleton framework as described above. As illustrated in FIG. 2C, the vertical supporting structures 202.1 through 202.a traverse along a vertical direction, for example, along a z-axis of the Cartesian coordinate system, from the base 208 of the mechanical supporting structure 200 to the apex 210 of the mechanical supporting structure 200. In the exemplary embodiment illustrated in FIG. 2C, the vertical supporting structures 202.1 through 202.a can be characterized as rotating clockwise, for example, from left to right, from the base 208 to the apex 210 to form a clockwise helical or swirl pattern. However, those skilled in the relevant art(s) will recognize that the vertical supporting structures 202.1 through 202.a can also be characterized as rotating counterclockwise, for example, from right to left, from the base 208 to the apex 210 to form a counterclockwise helical or swirl pattern without departing from the spirit and scope of the present disclosure. In some embodiments, the vertical supporting structures 202.1 through 202.a represent load bearing structures which support most of the weight of the mechanical supporting structure 200.

Figure 2D:
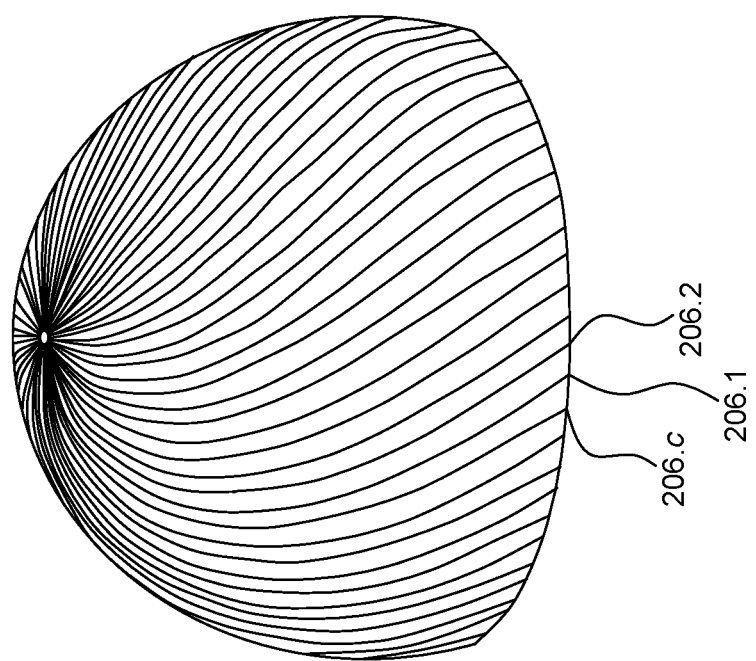

In the exemplary embodiment illustrated in FIG. 2D, the vertical mounting structures 206.1 through 206.c can be characterized as being vertical, or latitudinal, supporting structures. For convenience, the vertical mounting structures 206.1 through 206.c are indexed counterclockwise from 1 to c in FIG. 2C. The vertical mounting structures 206.1 through 206.c as illustrated in FIG. 2D can be connected to the vertical supporting structures 202.1 through 202.a and/or the horizontal supporting structures 204.1 through 204.b as illustrated in FIG. 2A above to form the mechanical supporting structure 200. As illustrated in FIG. 2D, the vertical mounting structures 206.1 through 206.c traverse along the vertical direction, for example, along the z-axis of the Cartesian coordinate system, from the base 208 of the mechanical supporting structure 200 to the apex 210 of the mechanical supporting structure 200. In some embodiments, the vertical mounting structures 206.1 through 206.c can be characterized as rotating counterclockwise, for example, from right to left, from the base 208 to the apex 210 to form a counterclockwise helical or swirl pattern. However, those skilled in the relevant art(s) will recognize that the vertical mounting structures 206.1 through 206.c can also be characterized as rotating clockwise, for example, from left to right, from the base 208 to the apex 210 to form a clockwise helical or swirl pattern without departing from the spirit and scope of the present disclosure.

In the exemplary embodiments illustrated in FIG. 2A through FIG. 2D, the vertical supporting structures 202.1 through 202.a and the horizontal supporting structures 204.1 through 204.b can be characterized as being load bearing structures which support most of the weight of the mechanical supporting structure 200. In these embodiments, the vertical mounting structures 206.1 through 206.c can be characterized as being non-load bearing structures which support almost none of the weight of the mechanical supporting structure 200. Rather, in these embodiments, the vertical mounting structures 206.1 through 206.c provide the mechanical lattice framework to connect the multiple electronic visual display panels of the electronic visual display device 104 to the mechanical supporting structure 200 as to be described in further detail below. In some embodiments, the vertical supporting structures 202.1 through 202.a and the horizontal supporting structures 204.1 through 204.b can be characterized being capable of undergoing more loading, such as, transverse loading, axial loading, and/or torsional loading to provide some examples, before failure when compared to the vertical mounting structures 206.1 through 206.c.

Exemplary Electronic Visual Display Device of the Exterior Display System

Figure 3A:
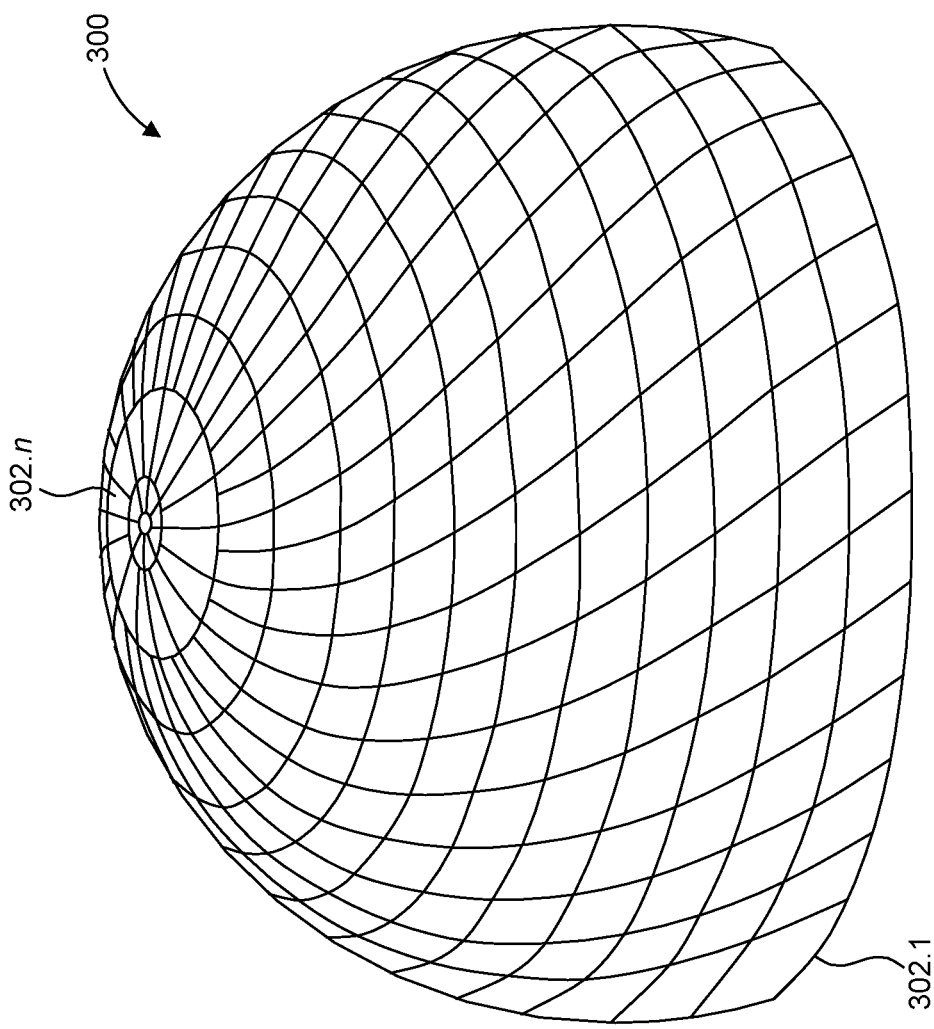
Figure 3B:
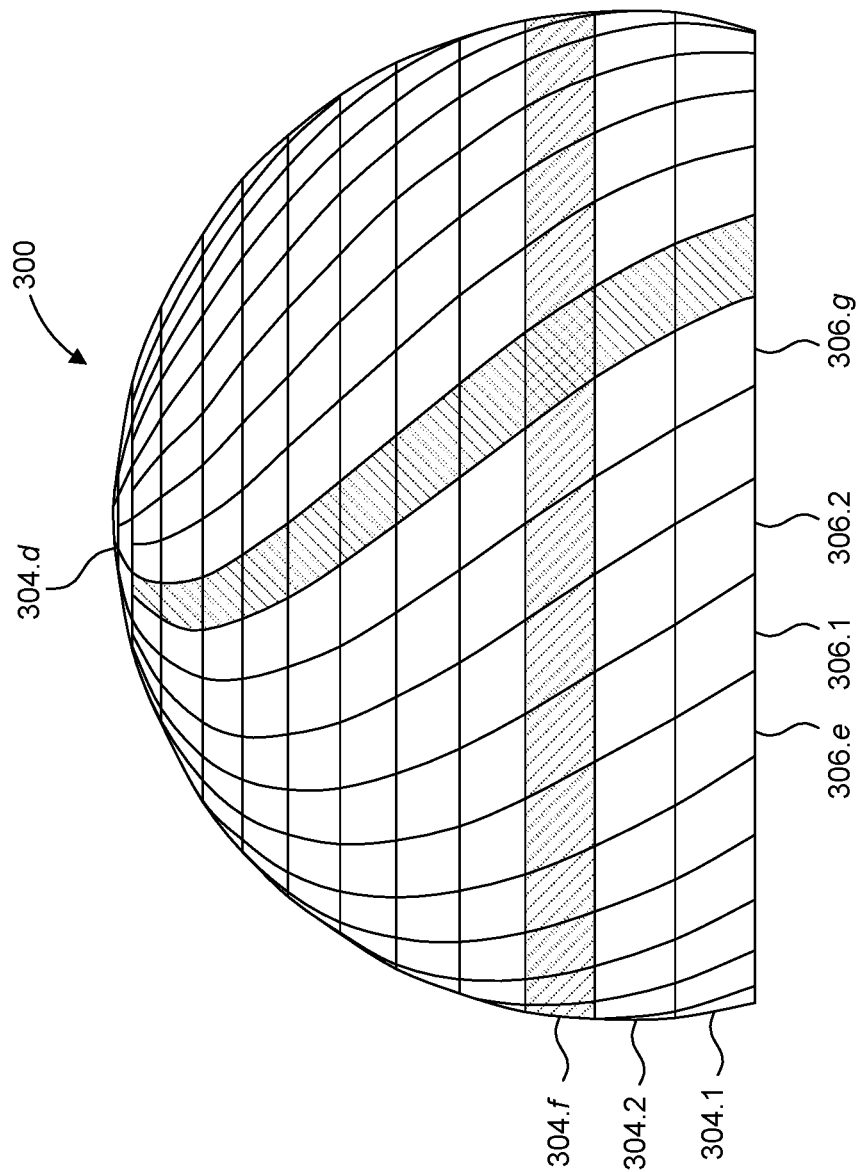
Figure 3C:
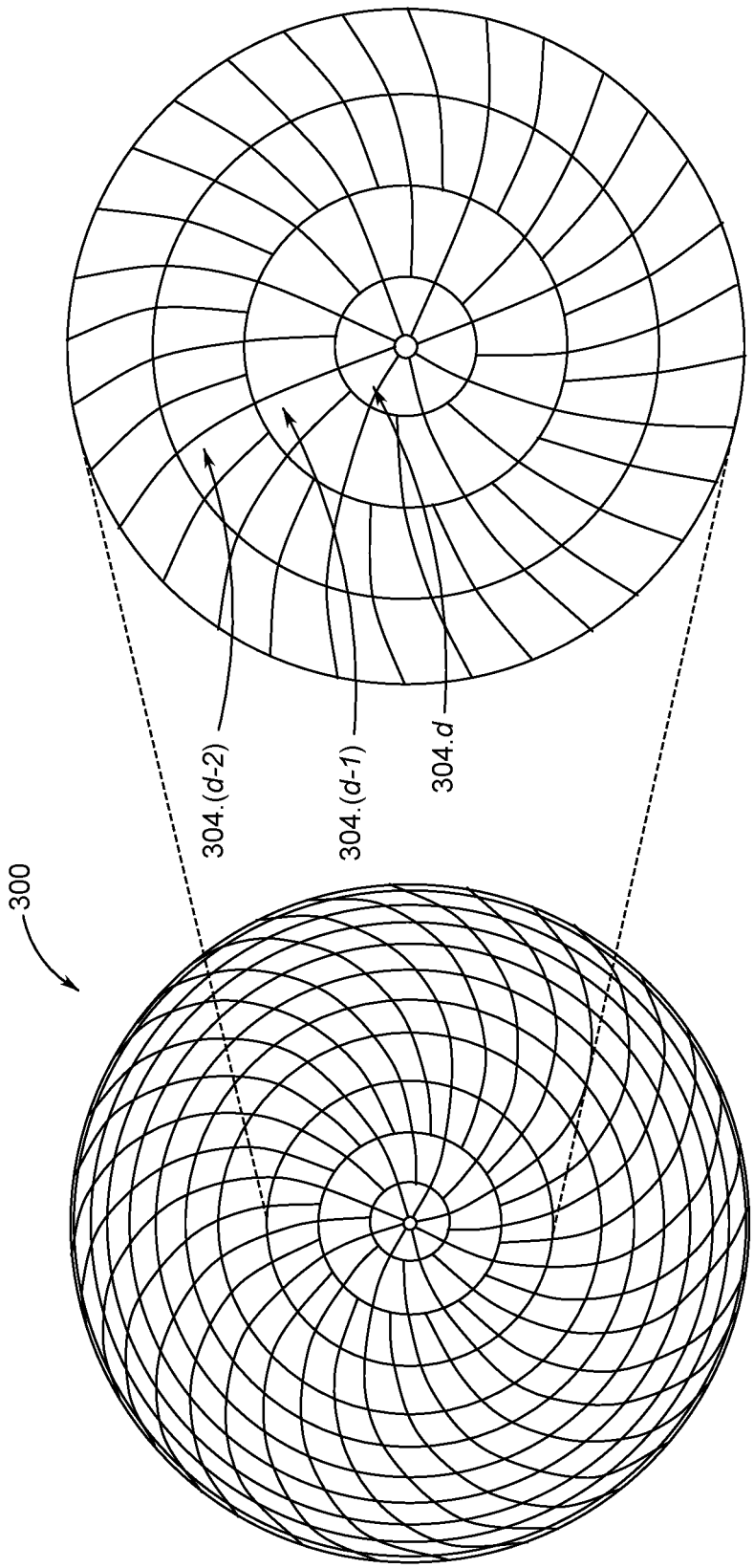

FIG. 3A through FIG. 3C graphically illustrate a simplified exemplary electronic visual display device that can be implemented within the exemplary exterior display system according to some embodiments of the disclosure. As described above, the electronic visual display device 104 can be implemented using multiple electronic visual display panels. As to be described in further detail below, these multiple electronic visual display panels can be connected to a mechanical supporting structure, such as the mechanical supporting structure 200 as described above in FIG. 2, to form an electronic visual display device 300. Although FIG. 3A through FIG. 3C illustrate the electronic visual display device 300 as having a spherical, or spherical-like, shape, this is for illustrative purposes only. Those skilled in the relevant art(s) will recognize that the electronic visual display device 300 can have another shape, such as a cube, a rectangular prism, a cone, a cylinder, and/or any combination thereof to provide some examples, without departing from the spirit and scope of the present disclosure. As illustrated in FIG. 3A, the electronic visual display device 300 can include electronic visual display panels 302.1 through 302.n that are circumferentially, or azimuthally, configured and arranged around the mechanical supporting structure 200. The electronic visual display device 300 can represent an exemplary embodiment of the electronic visual display device 104 as described above in FIG. 1.

In the exemplary embodiment illustrated in FIG. 3A, the electronic visual display panels 302.1 through 302.n are circumferentially, or azimuthally, configured and arranged around the mechanical supporting structure to form a convex polyhedron, such as a geodesic polyhedron or a spherical polyhedron to provide some examples, or a portion thereof. In some embodiments, each electronic visual display panel from among the electronic visual display panels 302.1 through 302.n can present a corresponding portion of the visual media 102 as to be described in further detail below. In these embodiments, the electronic visual display panels 302.1 through 302.n can include between approximately 4,500 and approximately 5,500 electronic visual display panels to present the visual media 102 in its entirety. As illustrated in FIG. 3A, the electronic visual display panels 302.1 through 302.n is configured and arranged to be geometric shapes, such as quadrilaterals as illustrated in FIG. 3A, rectangles, squares, and/or polygons, and/or any other suitable shapes that will be apparent to those skilled in the relevant art(s) without departing from the spirit and scope of the present disclosure. As illustrated in FIG. 3A, the electronic visual display panels 302.1 through 302.n traverse along the vertical direction, for example, along the z-axis of the Cartesian coordinate system, from a base of the electronic visual display device 300 to an apex of the electronic visual display device 300. In some embodiments, the electronic visual display panels 302.1 through 302.n can be characterized as rotating counterclockwise, for example, from right to left, from the base of the electronic visual display device 300 to the apex of the electronic visual display device 300 to form a counterclockwise helical or swirl pattern as illustrated in FIG. 3A. However, those skilled in the relevant art(s) will recognize that the electronic visual display panels 302.1 through 302.n can be characterized as rotating clockwise, for example, from left to right, from the base of the electronic visual display device 300 to the apex of the electronic visual display device 300 without departing from the spirit and scope of the present disclosure.

As illustrated in FIG. 3B, the electronic visual display panels 302.1 through 302.n can be indexed as a series of sphere levels 304.1 through 304.d and/or a series of sphere bays 306.1 through 306.e. For convenience, the sphere bays 306.1 through 306.e are indexed counterclockwise from 1 to e in FIG. 3B. In the exemplary embodiment illustrated in FIG. 3B, the sphere levels 304.1 through 304.d traverse in horizontal directions for example, parallel to different x-y planes of the Cartesian coordinate system. The sphere levels 304.1 through 304.d can be characterized as being concentric three-dimensional geometric shapes, for example, cylinders, or cylinder-like, as illustrated in FIG. 3B, which are situated on the different parallel x-y planes of the Cartesian coordinate system. As an example, a sphere level 304.f from among the sphere levels 304.1 through 304.d is illustrated in FIG. 3B using a light gray shading. The different parallel x-y planes of the Cartesian coordinate system can traverse from the base of the electronic visual display device 300 to the apex of the electronic visual display device 300. Those horizontal supporting structures from among the horizontal supporting structures 204.1 through 204.b which are closer in distance toward the base 208 of the mechanical supporting structure 200 can be characterized as having a greater radius, diameter, and/or circumference than those horizontal supporting structures from among the horizontal supporting structures 204.1 through 204.b which are further in distance from the base 208.

Similarly, as illustrated in FIG. 3B, the sphere bays 306.1 through 306.e represent different vertical columns of the visual display panels 302.1 through 302.n. In some embodiments, the sphere bays 306.1 through 306.e represent different vertical configuration and arrangements of the electronic visual display panels 302.1 through 302.n along a vertical direction, for example, along the z-axis of the Cartesian coordinate system. In some embodiments, the sphere bays 306.1 through 306.e can be characterized as rotating counterclockwise, for example, from right to left, from the base of the electronic visual display device 300 to the apex of the electronic visual display device 300 to form a counterclockwise helical or swirl pattern. As an example, a sphere bay 306.g from among the sphere bays 306.1 through 306.e is illustrated in FIG. 3B using a dark gray shading.

In the exemplary embodiment illustrated in FIG. 3B, those electronic visual display panels from the electronic visual display panels 302.1 through 302.n within each sphere level from among the sphere levels 304.1 through 304.d have substantially similar geometric shapes, for example, substantially similar quadrilaterals. In some embodiments, these similarities in shapes can ease the manufacturability of the electronic visual display panels 302.1 through 302.n. In these embodiments, a finite number d of different configurations and arrangements electronic visual display panels 302.1 through 302.n can be used to manufacture the electronic visual display device 300. As an example, a first configuration and arrangement of the electronic visual display panels 302.1 through 302.n can be manufactured for electronic visual display panels from among a first sphere level from among the sphere levels 304.1 through 304.d. In this example, a second configuration and arrangement of the electronic visual display panels 302.1 through 302.n, different from the first configuration and arrangement, can be manufactured for electronic visual display panels from among a second sphere level from among the sphere levels 304.1 through 304.d. In the exemplary embodiment illustrated in FIG. 3B, those electronic visual display panels from the electronic visual display panels 302.1 through 302.n within each sphere bay from among the sphere bays 306.1 through 306.e have substantially different geometric shapes, for example, substantially different quadrilaterals. In some embodiments, those electronic visual display panels from among the electronic visual display panels 302.1 through 302.n which are closer in distance toward the base of the electronic visual display device 300 can be characterized as having a larger surface area than those electronic visual display panels from among the electronic visual display panels 302.1 through 302.n which are further in distance from the base of the electronic visual display device 300.

In the exemplary embodiment illustrated in FIG. 3C, those electronic visual display panels from among the electronic visual display panels 302.1 through 302.n which are closer in distance toward the apex of the electronic visual display device 300 can be characterized as having minimal surface areas to ease the manufacturability of the electronic visual display panels 302.1 through 302.n. Generally, those electronic visual display panels from among the electronic visual display panels 302.1 through 302.n which are closer in distance toward the apex of the electronic visual display device 300 have smaller surface areas than those electronic visual display panels from among the electronic visual display panels 302.1 through 302.n which are further in distance from the apex of the electronic visual display device 300. However, in the exemplary embodiment illustrated in FIG. 3C, those electronic visual display panels from among the electronic visual display panels 302.1 through 302.n which are near the apex of the electronic visual display device 300, for example, within the sphere level 304.(d-1) and the sphere level 304.d, may have a modified construction relative to those electronic visual display panels from among the electronic visual display panels 302.1 through 302.n which are closer in distance toward the base of the electronic visual display device 300, for example, within the sphere level 304.1 and the sphere level 304.(d—2).

Exemplary Mechanical Connecting of the Exemplary Electronic Visual Display Device to the Exemplary Mechanical Supporting Structure As described above, the exterior display system 100 can include multiple electronic visual display panels, such as the electronic visual display panels 302.1 through 302.n as described above in FIG. 3A through FIG. 3C to provide an example, that are connected the mechanical supporting structure 200 as described above in FIG. 2A through FIG. 2D, to form the electronic visual display device 104. In some embodiments, the mechanical support 200 structure can further include one or more adjustable mechanical mounting assemblies to connect the multiple electronic visual display panels to the mechanical supporting structure 200. In these embodiments, the one or more adjustable mechanical mounting assemblies can be adjusted to rotate an orientation, for example, a pitch, a roll, and/or a yaw, of the multiple electronic visual display panels in three-dimensional space.

Figure 4A:
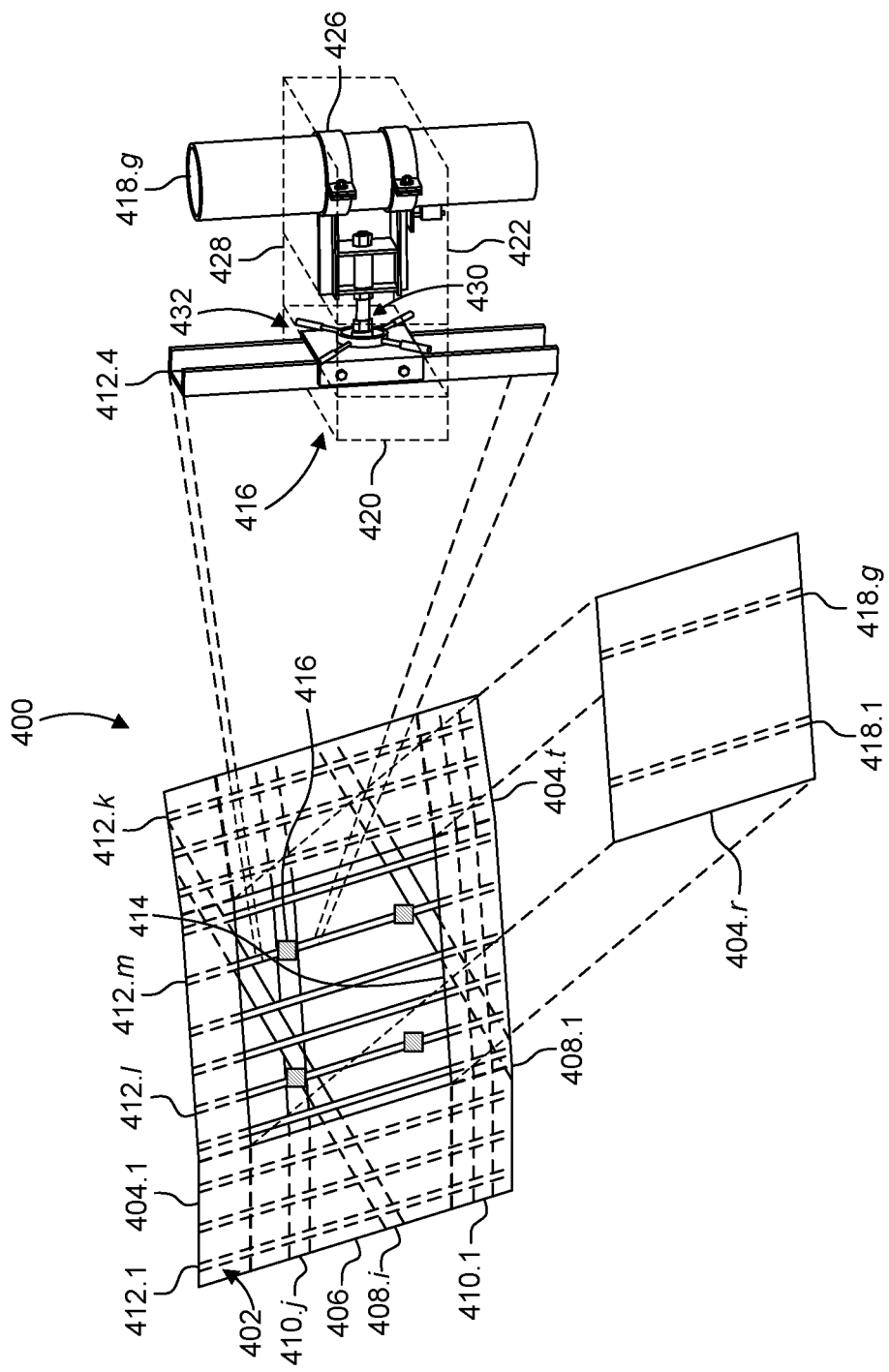
Figure 4B:
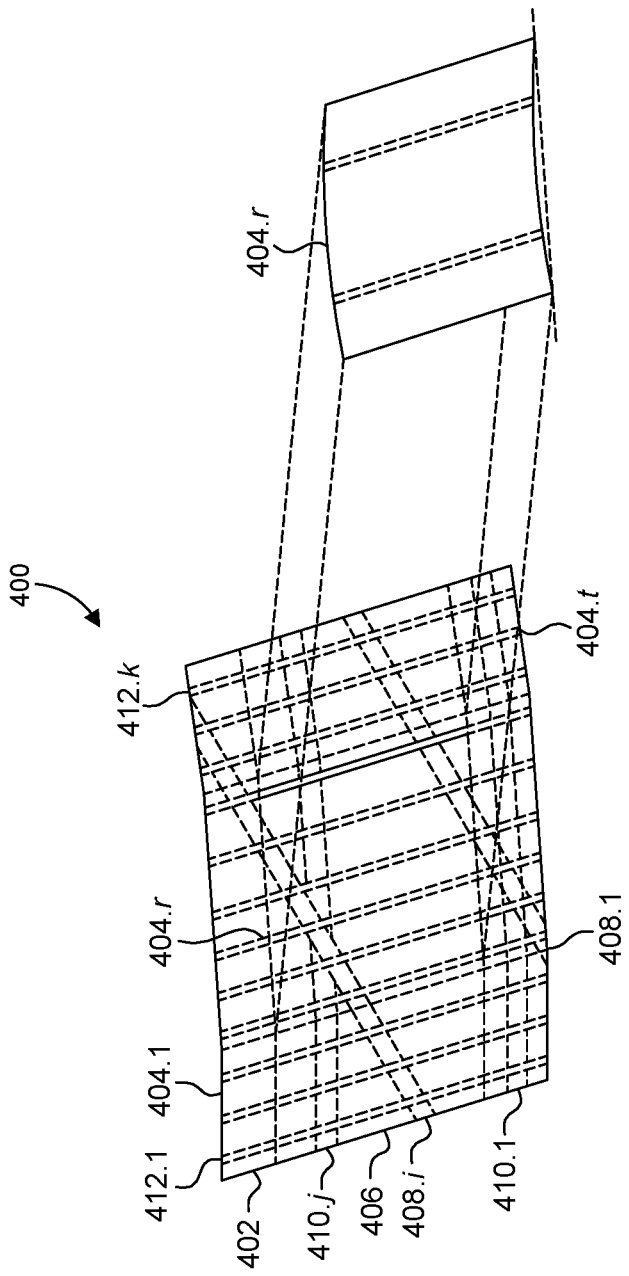

FIG. 4A and FIG. 4B graphically illustrate an adjustable mechanical mounting assembly that can be utilized to connect electronic visual display panels to the exemplary supporting structure according to some embodiments of the disclosure. In the exemplary embodiment illustrated in FIG. 4A and FIG. 4B, an exterior display system 400 includes a mechanical supporting structure 402, for example, a portion of the mechanical supporting structure 200 as described above in FIG. 2A through FIG. 2D. As illustrated in FIG. 4A and FIG. 4B, electronic visual display panels 404.1 through 404.t can be connected to the mechanical supporting structure 402 to form an electronic visual display device 406. The electronic visual display panels 404.1 through 404.t can represent an exemplary embodiment one or more of the electronic visual display panels 302.1 through 302.n as described above in FIG. 3A through FIG. 3C. The electronic visual display device 406 can represent a portion of the electronic visual display device 104 as described above in FIG. 1.

As illustrated in FIG. 4A and FIG. 4B, the mechanical supporting structure 402 includes vertical supporting structures 408.1 through 408.1, horizontal supporting structures 410.1 through 410.j, and vertical mounting structures 412.1 through 412.k. The number of vertical supporting structures 408, the number of horizontal supporting structures 410, and the vertical mounting structures 412 as illustrated in FIG. 4A and FIG. 4B are for exemplary purposes only. Those skilled in the relevant art(s) will recognize that the number of vertical supporting structures 408, the number of horizontal supporting structures 410, and the vertical mounting structures 412 can differ than as illustrated in FIG. 4A and FIG. 4B depending upon the shape of the electronic visual display device 406 without departing from the spirit and scope of the present disclosure. The vertical supporting structures 408.1 through 408.i, horizontal supporting structures 410.1 through 410.j, and the vertical mounting structures 412.1 through 412.k can represent exemplary embodiments of one or more structures from among the vertical supporting structures 202.1 through 202.a, the horizontal supporting structures 204.1 through 204.b, and the vertical mounting structures 206.1 through 206.c, respectively, as described above in FIG. 2A through FIG. 2D.

In the exemplary embodiment illustrated in FIG. 4A, the exterior display system 400 includes an electronic visual display panel window 414 for connecting an electronic visual display panel 404.r from among the electronic visual display panels 404.1 through 404.t to the mechanical supporting structure 402 to form the electronic visual display device 406 as illustrated in FIG. 4B. In some embodiments, the electronic visual display panel window 414 represents a region within the electronic visual display device 406 without the electronic visual display panels 404.1 through 404.t. In these embodiments, portions of the vertical supporting structures 408.1 through 408.1, the horizontal supporting structures 410.1 through 410.j, and/or the vertical mounting structures 412.1 through 412.k situated within the electronic visual display panel window 414 can be exposed allowing the electronic visual display panel 404.r to be connected to the mechanical supporting structure 402 to form the electronic visual display device 406 as illustrated in FIG. 4B. In some embodiments, the electronic visual display panels 404.1 through 404.t can bend or flex to conform to the shape of the mechanical supporting structure 402. In these embodiments, the electronic visual display panels 404.1 through 404.t can be characterized as being flexible, or semi-flexible, to allow the electronic visual display panels 404.1 through 404.t to conform to the shape of the mechanical supporting structure 402. In the exemplary embodiment illustrated in FIG. 4B, the electronic visual display panel 404.r can bend or flex to conform to the shape of the mechanical supporting structure 402 when attached to the vertical supporting structures 408.1 through 408.i, horizontal supporting structures 410.1 through 410.j, and/or the vertical mounting structures 412.1 through 412.k. In some embodiments, the electronic visual display panel 404.r can bend or flex to be concave to shape as illustrated in FIG. 4B, when the mechanical supporting structure 402 approximates a portion of a sphere, for example, a hemisphere, also referred to as a dome.

As illustrated in FIG. 4A, the mechanical supporting structure can include one or more adjustable mechanical mounting assemblies 416 to connect the electronic visual display panels 404.1 through 404.t to the mechanical supporting structure 402. For example, as illustrated in FIG. 4A, the one or more adjustable mechanical mounting assemblies 416 can connect the vertical mounting structure 412.l and the vertical mounting structure 412.m situated within the electronic visual display panel window 414 to electronic visual display device mounting structures 418.1 through 418.g within the electronic visual display panel 404.r. In the exemplary embodiment illustrated in FIG. 4A, exemplary locations for the one or more adjustable mechanical mounting assemblies 416 are illustrated using solid boxes. However, those skilled in the relevant art(s) will recognize that other mounting locations within the mechanical supporting structure 402 are possible without departing from the spirit and scope of the present disclosure. In the exemplary embodiment illustrated in FIG. 4A, the one or more adjustable mechanical mounting assemblies 416 are connected to the mechanical supporting structure 402, for example, the vertical mounting structure 412.l and 412.m. However, those skilled in the relevant art(s) will recognize that the one or more adjustable mechanical mounting assemblies 416 can be connected to any of the vertical supporting structures 408.1 through 408.1, the horizontal supporting structures 410.1 through 410.j, and/or the vertical mounting structures 412.1 through 412.k that are exposed within the electronic visual display panel window 414 without departing from the spirit and scope of the present disclosure.

As illustrated in FIG. 4A, the one or more adjustable mechanical mounting assemblies 416 can include a mechanical supporting member 420 and an electronic visual display panel supporting member 422. In the exemplary embodiment illustrated in FIG. 4A, the mechanical supporting member 420 can be connected to a vertical mounting structure from among the vertical mounting structures 412.1 through 412.k, such as the vertical mounting structure 412.m to provide an example. Similarly, the display panel supporting member 422 can be connected to a visual display device mounting structure from among the electronic visual display device mounting structures 418.1 through 418.g, such as the visual display device mounting structure 418.g to provide an example. In the exemplary embodiment illustrated in FIG. 4A, the display panel supporting member 422 can include one or more mounting clamps 426 to connect the visual display device mounting structure of the electronic visual display panels 404.1 through 404.t and the display panel supporting member 422. In some embodiments, the one or more mounting clamps 426 can include a first portion that can be connected to the display panel supporting member 422. In these embodiments, the one or more mounting clamps 426 can further include a second portion that can be connected to the first portion using various fasteners, such as nuts, screws, bolts, rivets, pins, and/or lags to provide some examples, once the visual display device mounting structure of the electronic visual display panel 404.r is situated between the first portion and the second portion.

In the exemplary embodiment illustrated in FIG. 4A, the one or more adjustable mechanical mounting assemblies 416 can include further include a mechanical coupling member 428 to connect the mechanical supporting member 420 and the electronic visual display panel supporting member 422. As illustrated in FIG. 4A, the mechanical coupling member 428 can include a mechanical shaft 430 to connect the mechanical supporting member 420 and the electronic visual display panel supporting member 422. In some embodiments, the mechanical coupling member 428 can be adjusted to determine a lateral position of the mechanical shaft 430 relative to its longitudinal axis and/or an orientation of the mechanical shaft 430 about its longitudinal axis. As an example, a mechanical crank 432, as illustrated in FIG. 4A, can be used to angularly adjust, for example, rotate, the mechanical shaft 430 to adjust the orientation, for example, a pitch, a roll, and/or a yaw, of the electronic visual display panels 404.1 through 404.$t$ about its longitudinal axis. In these embodiments, the mechanical crank 432 can be used rotate the mechanical shaft 430 along its longitudinal axis to rotate the electronic visual display panel supporting member 422 relative to the mechanical supporting member 420. In some embodiments, the mechanical crank 432 can be used to laterally adjust the mechanical shaft 430 to adjust a lateral position of the electronic visual display panel 404.$r$ relative to its longitudinal axis. In these embodiments, the mechanical crank 432 can be used to maneuver the mechanical shaft 430 along to its longitudinal axis to increase and/or decrease a distance between the mechanical supporting member 420 and the electronic visual display panel supporting member 422. In some embodiments, the mechanical shaft 430 and/or the mechanical crank 432 can adjust, or finely tune, the lateral position and/or the orientation the electronic visual display panel 404.$r$ to provide a seamless, or near seamless, alignment of the electronic visual display panels 404.1 through 404.$t$ in the three-dimensional space.

Exemplary Electronic Visual Display Panels that can be Implemented within the Exemplary Electronic Visual Display Device As described above, multiple electronic visual display panels, such as the electronic visual display panels 302.1 through 302.$n$ as described above in FIG. 3A through FIG. 3C, can be connected to a mechanical supporting structure, such as the mechanical supporting structure 200 as described above in FIG. 2A through FIG. 2D, to form the electronic visual display device 104. As to be described in further detail below, each of these multiple electronic visual display panels can include multiple groups of multiple light-emitting diodes (LEDs), also referred to as electronic LED disc assemblies, which are configured and arranged in a series of one or more rows and/or a series of one or more columns to form an array of LEDs.

Figure 5A:
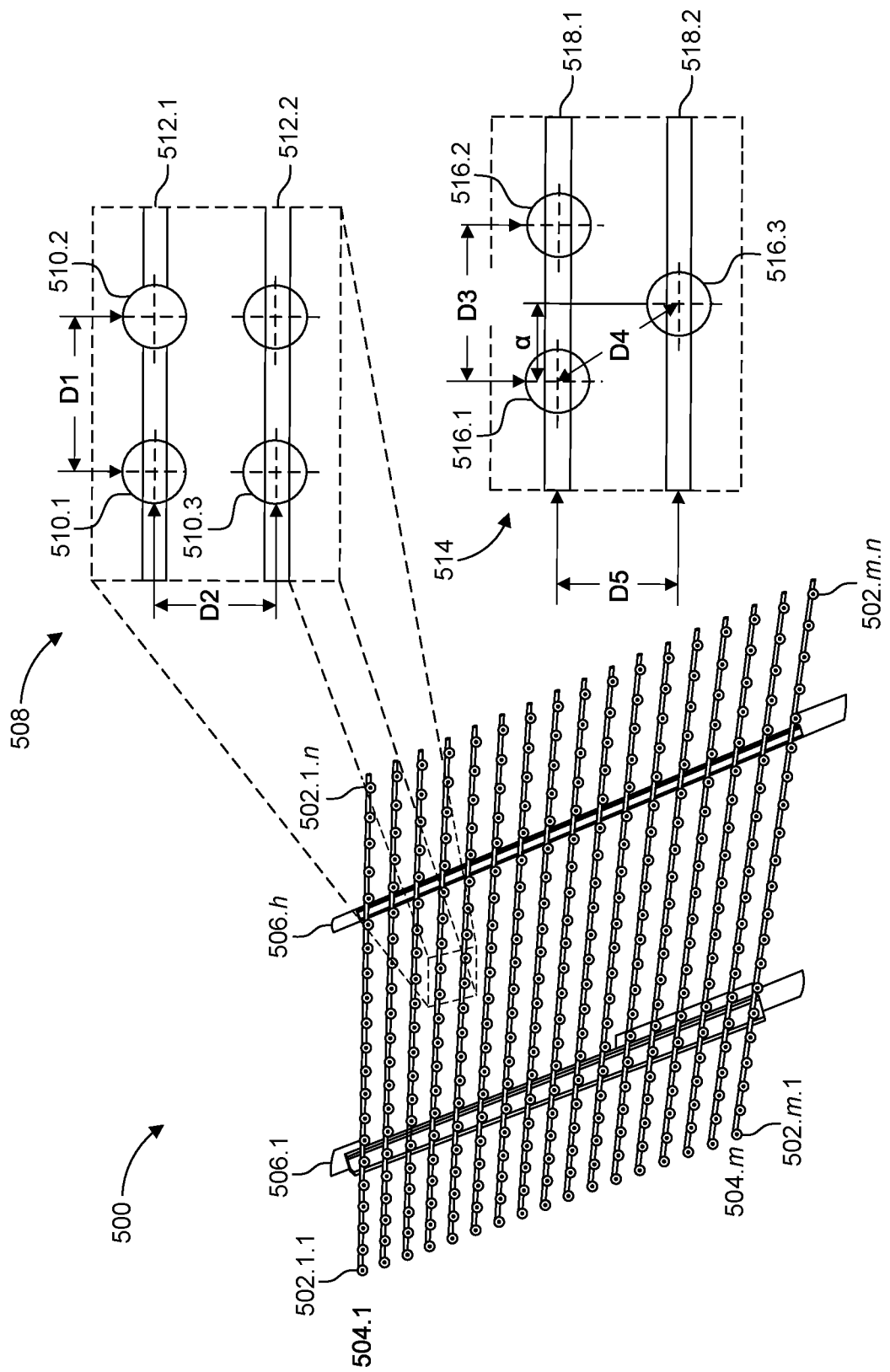
Figure 5B:
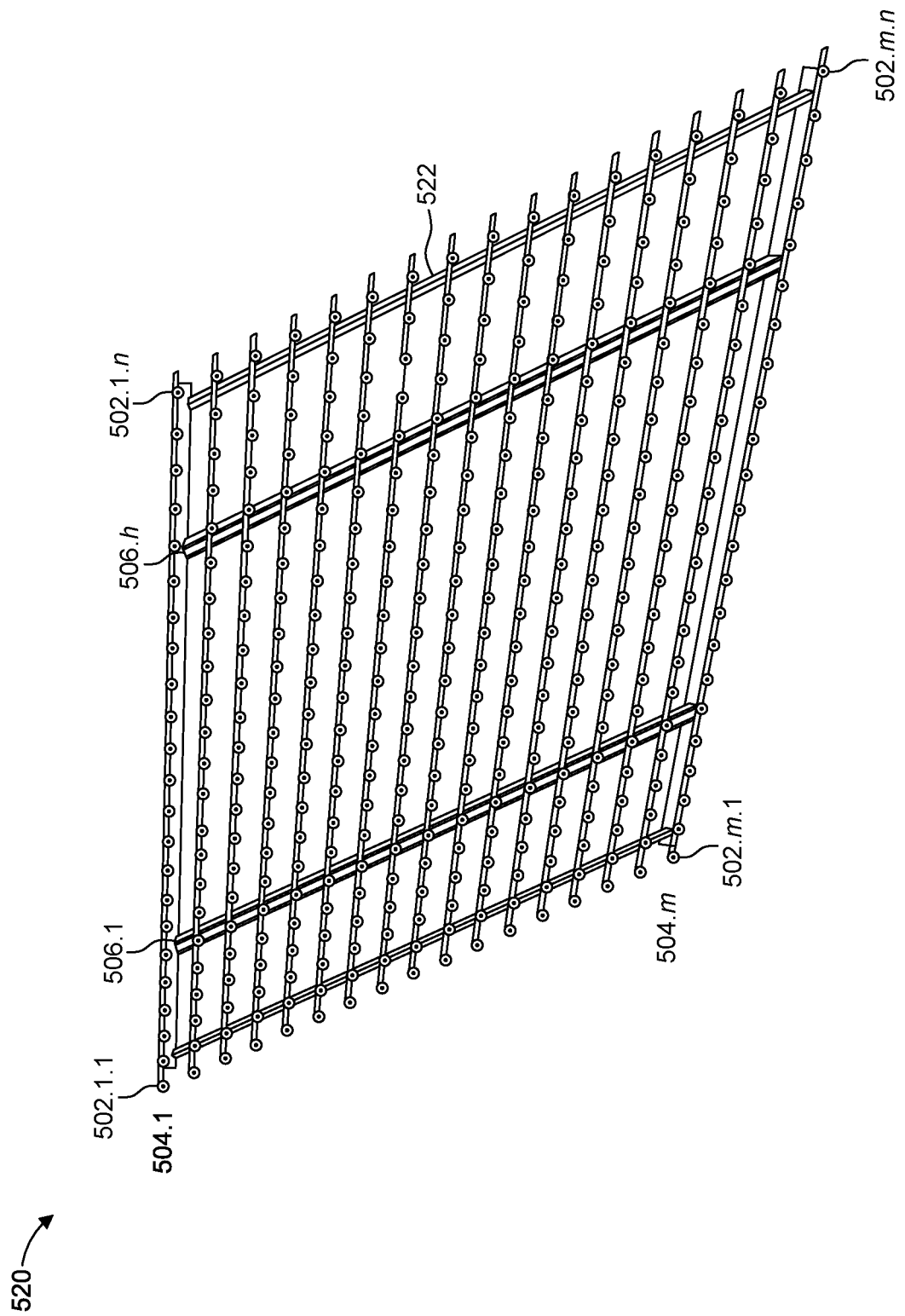
Figure 5C:
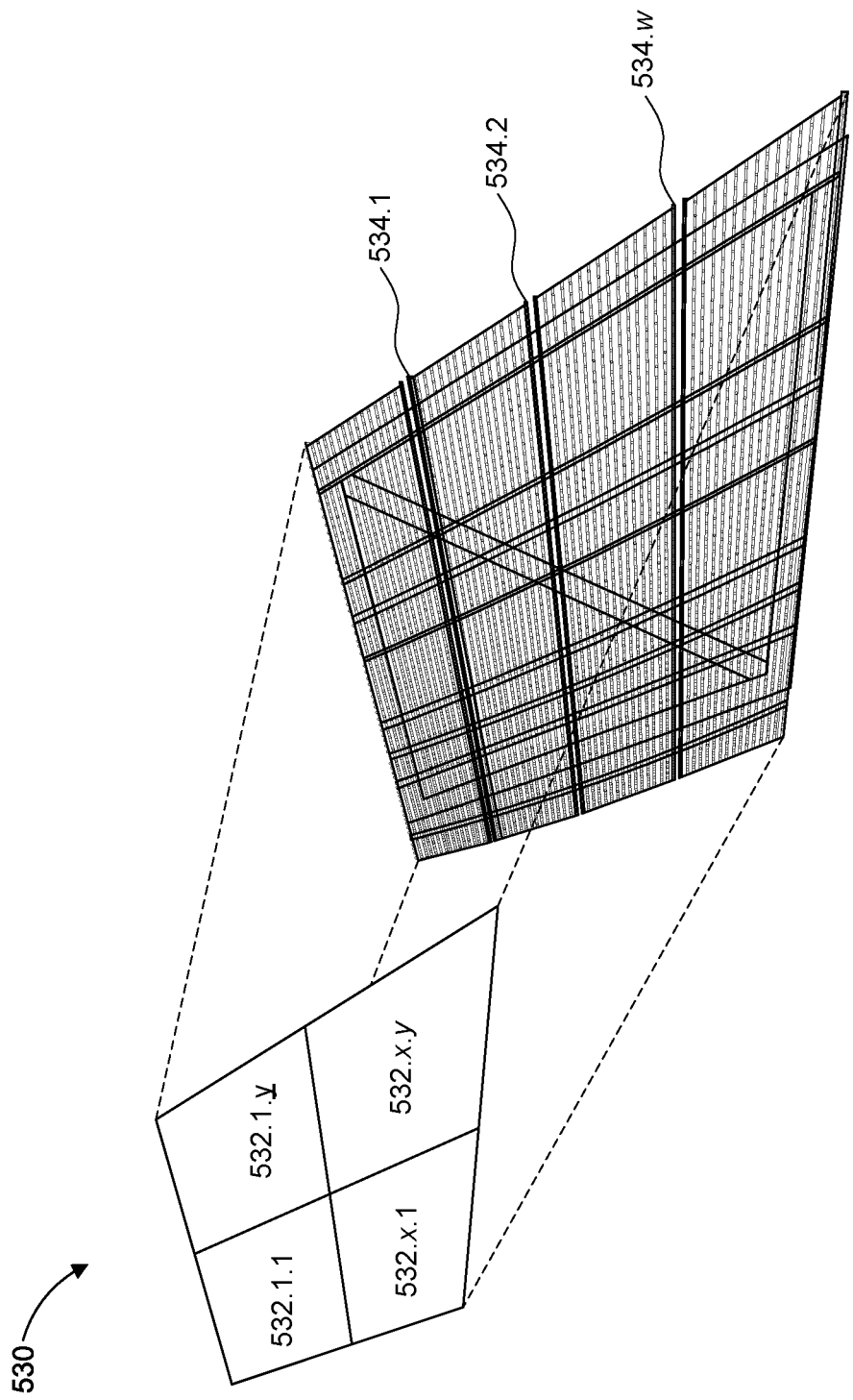

FIG. 5A through FIG. 5C graphically illustrate various exemplary electronic visual display panels that can be implemented within the exemplary electronic visual display device according to some embodiments of the disclosure. As to be described in further detail below, the electronic visual display device 104 can include one or more electronic visual display panels. In some embodiments, each of these electronic visual display panels can be characterized having one or more modular display panels that are configured and arranged in a series of rows and/or a series of columns. In some embodiments, each of these modular display panels can include multiple groups of multiple light-emitting diodes (LEDs), also referred to as electronic LED disc assemblies, which are configured and arranged in a series of one or more rows and/or a series of one or more columns to form an array of LEDs. As to be described in further detail below, the one or more electronic visual display panels can be connected to a mechanical supporting structure, such as the mechanical supporting structure 200 as described above in FIG. 2A through FIG. 2D, to form the electronic visual display device 104.

In the exemplary embodiment illustrated in FIG. 5A and FIG. 5B, a modular display panel 500 and a modular display panel 520 can include electronic LED disc assemblies 502.1.1 through 502.$m.n$ that are connected to one or more visual display device mounting structures 506.1 through 506.$h$. In some embodiments, the electronic LED disc assemblies 502.1.1 through 502.$m.n$ can be configured and arranged as a series of m-rows and/or a series of n-columns to form an array of electronic LED disc assemblies. Although the modular display panel 500 and the modular display panel 520 are illustrated as being a rectangle in FIG. 5A and FIG. 5B, those skilled in the relevant art(s) will recognize that the modular display panel 500 and the modular display panel 520 can be configured and arranged to be other geometric shapes, such as quadrilaterals, squares, and/or polygons, and/or any other suitable shapes that will be apparent to those skilled in the relevant art(s) without departing from the spirit and scope of the present disclosure. In some embodiments, each electronic LED disc assembly from among the electronic LED disc assemblies 502.1.1 through 502.$m$.n can be characterized as forming a pixel of the electronic visual display device 104. As illustrated in FIG. 5A and FIG. 5B, the electronic LED disc assemblies 502.1.1 through 502.$m$.n are connected to carrier rail structures 504.1 through 504.$m$. In some embodiments, the carrier rail structures 504.1 through 504.$m$ represent mechanical structures to mount electronic LED disc assemblies 502.1.1 through 502.$m.n$. Those electronic LED disc assemblies from among the electronic LED disc assemblies 502.1.1 through 502.$m.n$ within each row from among the series of m-rows are connected to a corresponding carrier rail structure from among carrier rail structures 504.1 through 504.$m$. For example, the electronic LED disc assemblies 502.1.1 through 502.1.$n$ with a first row from among the series of m-rows are connected to a carrier rail structure 504.1 from among the carrier rail structures 504.1 through 504.$m$. In some embodiments, the carrier rail structures 504.1 through 504.$m$ can include multiple mechanical LED disc mounts situated along the carrier rail structures 504.1 through 504.$m$ at various distances. In these embodiments, the multiple mechanical LED disc mounts can be approximately equidistant from one another along the carrier rail structures 504.1 through 504.$m$ and/or can be situated at different distances from one another along the carrier rail structures 504.1 through 504.$m$.

As illustrated in FIG. 5A, the modular display panel 520 can be characterized as including a first configuration and arrangement 508 of the electronic LED disc assemblies 502.1.1 through 502.$m.n$. In the exemplary embodiment illustrated in FIG. 5A, the first configuration and arrangement 508 of the electronic LED disc assemblies 502.1.1 through 502.$m.n$ can be characterized as being a one-dimensional equidistant, or near-equidistant, configuration and arrangement 508 of the electronic LED disc assemblies 502.1.1 through 502.$m.n$ along the carrier rail structures 504.1 through 504.$m$. In some embodiments, the electronic LED disc assemblies 502.1.1 through 502.$m.n$ are horizontally, for example, along the x-axis of the Cartesian coordinate system, equidistant, or a near-equidistant, with respect to one another or vertically, for example, along the y-axis of the Cartesian coordinate system, equidistant, or a near-equidistant, with respect to one another. As illustrated in FIG. 5A, adjacent, neighboring electronic LED disc assemblies along a corresponding carrier rail structure, for example, from among the carrier rail structures 504.1 through 504.*m*, such as an electronic LED disc assembly 510.1 and an electronic LED disc assembly 510.2 from among the electronic LED disc assemblies 502.1.1 through 502.*m.n* along a carrier rail structure 512.1 from among the carrier rail structures 504.1 through 504.*m* to provide an example, are separated, or spaced-apart, by a one-dimensional center-to-center distance D1 along the x-axis of the Cartesian coordinate system. And adjacent, neighboring electronic LED disc assemblies along adjacent, neighboring carrier rail structures from among the carrier rail structures 504.1 through 504.*m*, such as the electronic LED disc assembly 510.1 along the carrier rail structure 512.1 and an electronic LED disc assembly 510.3 from among the electronic LED disc assemblies 502.1.1 through 502.*m.n* along a carrier rail structure 512.2 from among the carrier rail structures 504.1 through 504.*m* to provide an example, are separated, or spaced-apart, by a one-dimensional center-to-center distance D2 along the y-axis of the Cartesian coordinate system. In some embodiments, neighboring carrier rail structures from among the carrier rail structures 504.1 through 504.*m*, such as the carrier rail structure 512.1 and a carrier rail structure 512.2 from among the carrier rail structures 504.1 through 504.*m*, are similarly separated, or spaced-apart, by the center-to-center distance D2 along the y-axis of the Cartesian coordinate system. In some embodiments, the center-to-center distance D1 and the center-to-center distance D2 can be selected from a range between approximately 100 millimeters (mm) to approximately 300 mm, a range between approximately 150 mm to approximately 275 mm, and/or a range between approximately 200 mm to approximately 250 mm. In some embodiments, the center-to-center distance D1 and the center-to-center distance D2 can be approximately equal to each other.

Alternatively, or in addition to, the modular display panel 520 can be characterized as including a second configuration and arrangement 514 of the electronic LED disc assemblies 502.1.1 through 502.*m.n*. In the exemplary embodiment illustrated in FIG. 5A, the second configuration and arrangement 514 of the electronic LED disc assemblies 502.1.1 through 502.*m.n* can be characterized as being a two-dimensional equidistant, or near-equidistant, configuration and arrangement 508 of the electronic LED disc assemblies 502.1.1 through 502.*m.n* along the carrier rail structures 504.1 through 504.*m*. In some embodiments, the electronic LED disc assemblies 502.1.1 through 502.*m.n* are horizontally, for example, along the x-axis of the Cartesian coordinate system, equidistant, or a near-equidistant, with respect to one another and vertically, for example, along the y-axis of the Cartesian coordinate system, equidistant, or a near-equidistant, with respect to one another. As illustrated in FIG. 5A, adjacent, neighboring electronic LED disc assemblies along a corresponding carrier rail structure, for example, from among the carrier rail structures 504.1 through 504.*m*, such as an electronic LED disc assembly 516.1 and an electronic LED disc assembly 516.2 from among the electronic LED disc assemblies 502.1.1 through 502.*m.n* along a carrier rail structure 518.1 from among the carrier rail structures 504.1 through 504.*m* to provide an example, are separated, or spaced-apart, by a one-dimensional center-to-center distance D3 along the x-axis of the Cartesian coordinate system. And adjacent, neighboring electronic LED disc assemblies along adjacent, neighboring carrier rail structures from among the carrier rail structures 504.1 through 504.*m*, such as the electronic LED disc assembly 516.1 along the carrier rail structure 518.1 and an electronic LED disc assembly 516.3 from among the electronic LED disc assemblies 502.1.1 through 502.*m.n* along a carrier rail structure 518.2 from among the carrier rail structures 504.1 through 504.*m* to provide an example, are separated, or spaced-apart, by a two-dimensional center-to-center distance D4 along the x-axis and y-axis of the Cartesian coordinate system. In some embodiments, the center-to-center distance D3 and the center-to-center distance D4 can be selected from a range between approximately 100 millimeters (mm) to approximately 300 mm, a range between approximately 150 mm to approximately 275 mm, and/or a range between approximately 200 mm to approximately 250 mm. In some embodiments, the center-to-center distance D4 and the center-to-center distance D4 can be approximately equal to each other. As further illustrated in FIG. 5A, neighboring carrier rail structures from among the carrier rail structures 504.1 through 504.*m*, such as the carrier rail structure 518.1 and the carrier rail structure 518.2 are separated, or spaced-apart, by a two-dimensional center-to-center distance D5 along the x-axis and y-axis of the Cartesian coordinate system. In some embodiments, the center-to-center distance D5 can be approximated by:

$$D_5 = \sqrt{D_4^2 - \alpha^2}, \quad (1)$$

where α denotes a horizontal distance from the electronic LED disc assembly 516.1 to a vertical line normal from the electronic LED disc assembly 516.3 as illustrated in FIG. 5A.

In the exemplary embodiment illustrated in FIG. 5A, the first configuration and arrangement 508 and/or the second configuration and arrangement 514 of the electronic LED disc assemblies 502.1.1 through 502.*m.n* can allow environmental elements, such as precipitation and/or wind to provide some examples, as well as other debris to pass through the modular display panel 500. In some embodiments, the separation, namely, the center-to-center distance D2 and/or the center-to-center distance D5, between adjacent, neighboring carrier rail structures from among the carrier rail structures 504.1 through 504.*m*, such as between the carrier rail structure 512.1 and the carrier rail structure 512.2 and/or between the carrier rail structure 518.1 and the carrier rail structure 518.2 to provide some examples, provides openings, or holes, which allow the environmental elements as well as the other debris to pass between the adjacent, neighboring carrier rail structures. This prevents the environmental elements as well as the other debris from accumulating on the modular display panel 500 which could affect the operation of the modular display panel 500.

In the exemplary embodiment illustrated in FIG. 5B, the modular display panel 520 can further include a carrier supporting structure 522. In some embodiments, the carrier supporting structure 522 can include one or more carrier supporting structure members that are configured and arranged to be in a geometric shape, such as a circle, a rectangle, a square, and/or a polygon, and/or any other suitable geometric shape that will be apparent to those skilled in the relevant art(s) without departing from the spirit and scope of the present disclosure. Generally, this other suitable shape can represent any suitable regular geometric shape and/or irregular geometric shape that will be apparent to those skilled in the relevant art(s) without departing from the spirit and scope of the present disclosure. In some embodiments, the visual display device mounting structures 506.1 through 506.*h* can be integrated with the carrier supporting structure 522 as illustrated in FIG. 5B. In some embodiments, the carrier supporting structure 522 can be used to effectively shape a contour, or curvature, of the carrier rail structures 504.1 through 504.*m*. For example, a cross-sectional area of the carrier supporting structure 522 can be characterized as being flat or smooth without any contour, or curvature. In this example, the carrier rail structures 504.1 through 504.*m* can similarly be characterized as being flat or smooth when connected to the carrier supporting structure 522. As another example, the cross-sectional area of the carrier supporting structure 522 can be characterized as being curved having some contour, or curvature. In this other example, the carrier rail structures 504.1 through 504.*m* can similarly be characterized as having the same contour, or curvature, as the carrier supporting structure 522 when connected to the carrier supporting structure 522.

As illustrated in FIG. 5C, an electronic visual display panel 530 can include one or more modular display panels 532.1.1 through 532.*x.y*. The electronic visual display panel 530 can represent an exemplary embodiment of one or more of the electronic visual display panels 302.1 through 302.*n* as described above in FIG. 3A through FIG. 3C. In some embodiments, the one or more modular display panels 532.1.1 through 532.*x.y* can be implemented using one or more of the modular display panels 500 as illustrated in FIG. 5A and/or one or more of the modular display panels 520 as illustrated in FIG. 5B. In the exemplary embodiment illustrated in FIG. 5C, the one or more modular display panels 532.1.1 through 532.*x.y* can be configured and arranged as a series of x-rows and/or a series of y-columns to form the electronic visual display panel 530. In the exemplary embodiment illustrated in FIG. 5C, the visual display device mounting structure 506.1 and the visual display device mounting structure 506.2, as described above, of each of the one or more modular display panels 532.1.1 through 532.*x.y* within each column from among the series of y-columns are connected to one another to form the series of y-columns of the electronic visual display panel 530.

In the exemplary embodiment illustrated in FIG. 5C, the one or more modular display panels 532.1.1 through 532.*x.y* can be connected to visual display device mounting structures 534.1 through 534.*w* to form the electronic visual display panel 530. In some embodiments, the visual display device mounting structures 534.1 through 534.*w* can be connected to the vertical supporting structures 202.1 through 202.*a*, the horizontal supporting structures 204.1 through 204.*b*, and/or the vertical mounting structures 206.1 through 206.*c* as described above in FIG. 2A through FIG. 2D to connect the electronic visual display panel 530 to the mechanical supporting structure as described above in FIG. 4A and FIG. 4B. The visual display device mounting structures 534.1 through 534.*w* can represent an exemplary embodiment of the electronic visual display device mounting structures 418.1 through 418.*g* as described above in FIG. 4A and FIG. 4B.

Figure 6:
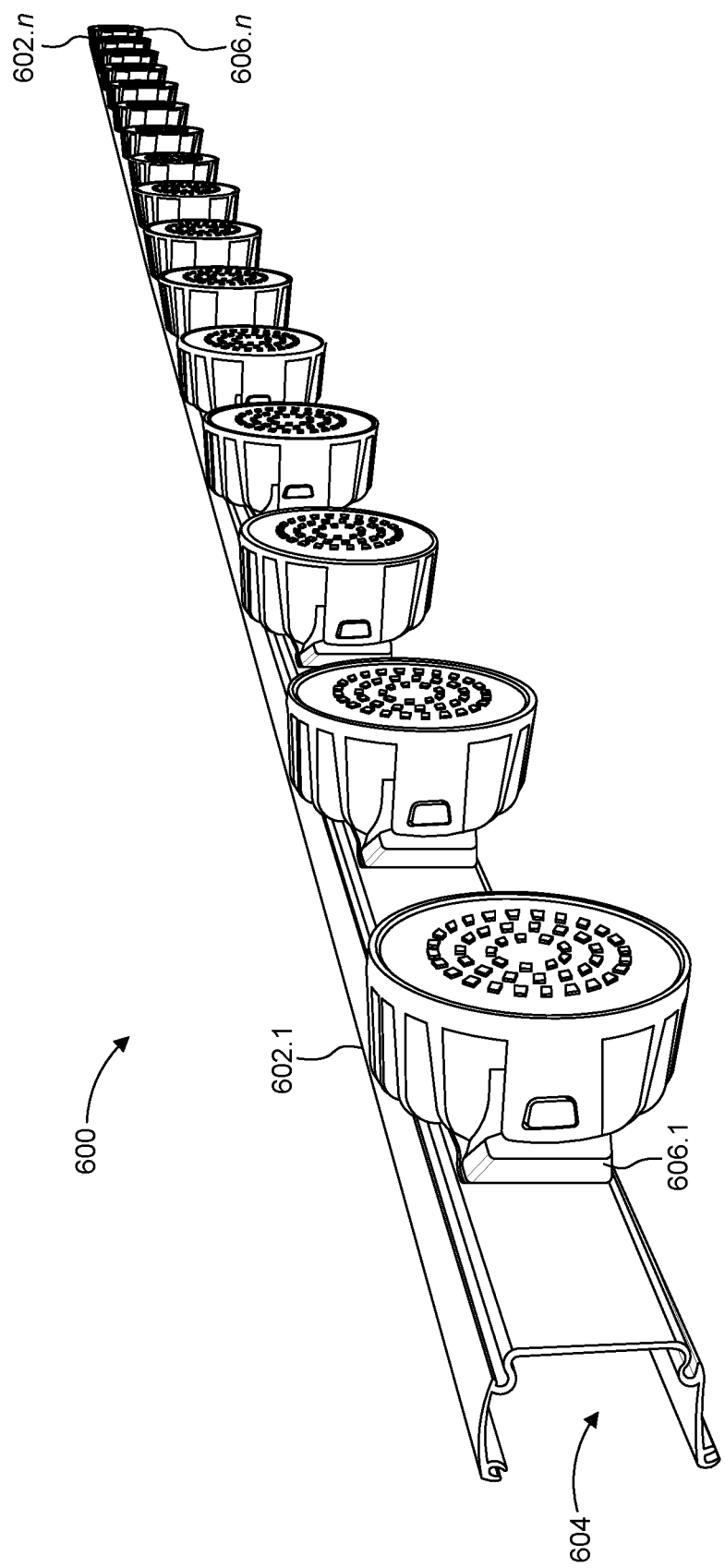

FIG. 6 graphically illustrates an exemplary row of electronic LED disc assemblies that can be implemented within the electronic visual display panels according to some embodiments of the disclosure. As described above, an electronic visual display panel, such as the modular display panel 500 and/or the electronic visual display panel, can include multiple electronic LED disc assemblies, such as the electronic LED disc assemblies 502.1.1 through 502.*m.n* as described above in FIG. 5A and FIG. 5B, which can be configured and arranged as a series of rows and/or a series of columns to form an array of electronic LED disc assemblies. The discussion of FIG. 6 to follow is to describe an exemplary row of electronic LED disc assemblies 600 from among the series of rows of the array of electronic LED disc assemblies. The row of electronic LED disc assemblies 600 can represent an exemplary embodiment of the one of the series of m-rows of the electronic LED disc assemblies 502.1.1 through 502.*m.n* as described above in FIG. 5A and FIG. 5B.

In the exemplary embodiment illustrated in FIG. 6, the row of electronic LED disc assemblies 600 includes electronic LED disc assemblies 602.1 through 602.*n* that are connected to the carrier rail structure 604. The carrier rail structure 604 can represent an exemplary embodiment of one or more of the carrier rail structures 504.1 through 504.*m* as described above in FIG. 5A and FIG. 5B. In some embodiments, the carrier rail structure 604 can include mechanical LED disc mounts 606.1 through 606.*n* to connect the electronic LED disc assemblies 602.1 through 602.*n* to the carrier rail structure 604. In these embodiments, the electronic LED disc assemblies 602.1 through 602.*n* and the mechanical LED disc mounts 606.1 through 606.*n* can be configured and arranged to form the interlocking connectors as described above, which are connected to one another by pushing the electronic LED disc assemblies 602.1 through 602.*n* into their corresponding mechanical LED disc mounts 606.1 through 606.*n*. In these embodiments, the interlocking capabilities of the electronic LED disc assemblies 602.1 through 602.*n* and/or the mechanical LED disc mounts 606.1 through 606.*n* allow the electronic LED disc assemblies 602.1 through 602.*n* to be replaced by pulling a defective, failing, or failed electronic LED disc assembly from among the electronic LED disc assemblies 602.1 through 602.*n* from its corresponding mechanical LED disc mounts 606.1 through 606.*n* and pushing in a new electronic LED disc assembly into the corresponding mechanical LED disc mount.

Figure 7:
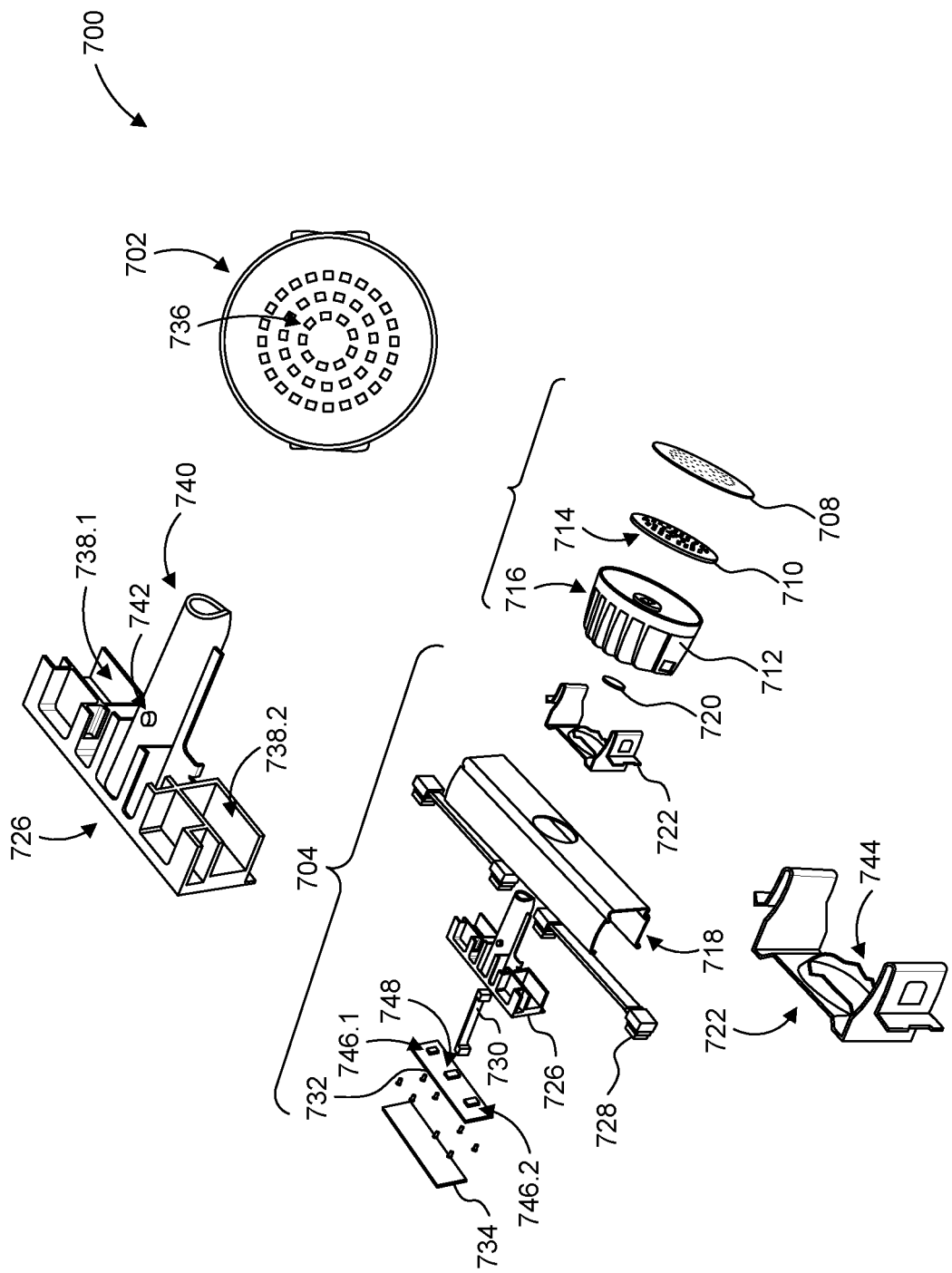

FIG. 7 graphically illustrates an exemplary electronic LED disc module that can be included within the exemplary row of electronic LED disc assemblies according to some embodiments of the disclosure. As described above, an electronic visual display panel, such as the modular display panel 520 as described above in FIG. 5C, can include multiple electronic LED disc assemblies, such as the electronic LED disc assemblies 502.1.1 through 502.*m.n* as described above in FIG. 5A and FIG. 5B. The discussion of FIG. 7 to follow is to describe an exemplary electronic LED disc module 700 from among the array of electronic LED disc assemblies. The electronic LED disc module 700 can represent an exemplary embodiment of the one of the electronic LED disc assemblies 502.1.1 through 502.*m.n* as described above in FIG. 5A and FIG. 5B. In the exemplary embodiment illustrated in FIG. 7, the electronic LED disc module 700 includes an electronic LED disc 702 and a carrier rail assembly 704. The electronic LED disc 702 can represent an exemplary embodiment of one or more of the electronic LED disc assemblies 602.1 through 602.*n*.

In the exemplary embodiment illustrated in FIG. 7, the electronic LED disc 702 can be configured to provide one or more pixels of an image, such as the visual media 102 as described above in FIG. 1. As illustrated in FIG. 7, the electronic LED disc 702 includes a mechanical cover 708, a LED assembly 710, and a mechanical display assembly 712. In the exemplary embodiment illustrated in FIG. 7, the mechanical cover 708 and the mechanical display assembly 712 can be configured and arranged to form the interlocking connectors as described above, which are connected to one another by pushing the mechanical cover 708 into the mechanical display assembly 712.

The LED assembly 710 can include one or more light-emitting diodes (LEDs) 736 which provide the one or more pixels of the image. In some embodiments, the one or more LEDs 736 are configured and arranged to be concentric geometric shapes, such as circles as illustrated in FIG. 7, rectangles, squares, and/or polygons, and/or any other suitable shapes that will be apparent to those skilled in the relevant art(s) without departing from the spirit and scope of the present disclosure. Generally, these other suitable shapes can represent any suitable regular geometric shape and/or irregular geometric shapes that will be apparent to those skilled in the relevant art(s) without departing from the spirit and scope of the present disclosure. In some embodiments, the one or more LEDs 736 are electrically connected to a printed circuit board (PCB) having various transmission lines, such as stripline or microstrip to provide some examples, to form electrical connections between the one or more LEDs 736 and an electrical connector 714. In some embodiments, the one or more LEDs 736 can be implemented using surface mount (SMT) LEDs and/or through-hole (TH) LEDs that are electrically connected to the PCB by, for example, soldering or any other suitable mechanical interconnection, such as silver conductive epoxy to provide an example, that will be recognized by those skilled in the relevant art(s) without departing from the spirit and scope of the present disclosure. In some embodiments, the one or more LEDs 736 can be fabricated onto a thin slice of semiconductor material, such as a silicon crystal, but can include other materials, or combinations of materials, such as sapphire or any other suitable material that will be apparent to those skilled in the relevant art(s) without departing from the spirit and scope of the present disclosure to form the LED assembly 710. As to be described in further detail below, the electrical connector 714 can electrically couple the LED assembly 710 and the electronic LED disc control assembly 730. In some embodiments, the electrical connector 714 can be implemented using a simple electrical board-to-board (BTB) connector such as a pin header or a box header; however, more complicated BTB connectors are possible as will be apparent to those skilled in the relevant art(s) without departing from the spirit and scope of the present disclosure.

The mechanical display assembly 712 represents a mechanical housing for the LED assembly 710. Although the mechanical display assembly 712 is illustrated as having a cylinder shape in FIG. 7, this is for exemplary purposes only. Those skilled in the relevant art(s) will recognize that the mechanical display assembly 712 can have another shape, such as a sphere, a cube, a rectangular prism, a cone, and/or any combination thereof to provide some examples. In some embodiments, the mechanical display assembly 712 can include a heat sink assembly 716 to transfer heat generated by the LED assembly 710 to ambient air surrounding the electronic LED disc module 700. In the exemplary embodiment, illustrated in FIG. 7, the heat sink assembly 716 can surround a periphery of the mechanical display assembly 712 in its entirety or a portion thereof. In some embodiments, the mechanical display assembly 712 can include an access opening, or hole, which can be utilized by the electronic LED disc control assembly 730 to access the electrical connector 714 as to be described in further detail below.

As illustrated in FIG. 7, the carrier rail assembly 704 connects the electronic LED disc module 700 to a carrier rail structure 718, such as a portion of one or more carrier rail structures from among the carrier rail structures 504.1 through 504.m as described above in FIG. 5A and FIG. 5B. The carrier rail assembly 704 can represent an exemplary embodiment of one or more of the mechanical LED disc mounts 606.1 through 606.n as described above in FIG. 6. In the exemplary embodiment illustrated in FIG. 7, carrier rail assembly 704 includes a mechanical weather seal 720, a mechanical LED disc mount 722, an electrical connection assembly 726, an electronic LED disc control assembly 730, an electronic LED disc signal routing assembly 732, and a mechanical cover 734.

The mechanical weather seal 720 provides weatherization for the carrier rail assembly 704. In some embodiments, the mechanical weather seal 720 can protect the carrier rail assembly 704 from environmental elements, such as sunlight, precipitation, wind, and/or humidity to provide some examples, which could affect the operation of the electronic LED disc 702. In some embodiments, the mechanical weather seal 720 can be implemented using one or more synthetic or semi-synthetic organic compounds or materials, also referred to as plastic, one or more organic materials, such as wood to provide an example, and/or any other suitable non-metallic material that will be apparent to those skilled in the relevant art(s) without departing from the spirit and scope of the present disclosure.

The mechanical LED disc mount 722 can be used connect the electronic LED disc 702 to the carrier rail structure 718. In some embodiments, the electronic LED disc 702 and the mechanical LED disc mount 722 can be configured and arranged to form the interlocking connectors as described above, which are connected to one another by pushing the electronic LED disc 702 into the mechanical LED disc mount 722. In these embodiments, the interlocking capabilities of the mechanical LED disc mount 722 allow the electronic LED disc 702 to be replaced by pulling a defective, failed, or failing electronic LED disc 702 from the mechanical LED disc mount 722 and pushing in a new electronic LED disc 702 into the mechanical LED disc mount 722.

The electrical connection assembly 726 includes one or more openings, or holes, 738.1 and 738.2 for mechanically and connecting one or more communication cables 728 to the electronic LED disc signal routing assembly 732. In some embodiments, the one or more openings, or holes, 738.1 and 738.2 and the one or more communication cables 728 can be configured and arranged to form the interlocking connectors as described above which are connected to one another by pushing connectors of the one or more communication cables 728 into the one or more openings, or holes, 738.1 and 738.2. In some embodiments, the electrical connection assembly 726 can include an interlocking access shaft 740 having an opening, or hole, to provide the electronic LED disc signal routing assembly 732 access to the electronic LED disc 702. As illustrated in FIG. 7, the interlocking access shaft 740 can include an interlocking screw protrusion 742 to mechanically secure the mechanical LED disc mount 722 to the carrier rail structure 718. In some embodiments, the interlocking access shaft 740 can be configured and arranged to slide through an opening, or hole, in the carrier rail structure 718 to expose the interlocking screw protrusion 742. In these embodiments, the mechanical LED disc mount 722 is configured and arranged to slide over the interlocking access shaft 740. As illustrated in FIG. 7, the mechanical LED disc mount 722 includes an interlocking screw assembly 744 which mechanically secures the mechanical LED disc mount 722 to the carrier rail structure 718 by rotating, or twisting, the mechanical LED disc mount 722 about the interlocking access shaft 740. This rotating, or twisting, of the mechanical LED disc mount 722 interlocks the interlocking screw protrusion 742 and the interlocking screw assembly 744 to mechanically secure the mechanical LED disc mount 722 to the carrier rail structure 718.

The electronic LED disc control assembly 730 can route various signals, such as power signals, control signals, and/or data signals to provide some examples, between the electronic LED disc signal routing assembly 732 and the electronic LED disc 702. In some embodiments, the electronic LED disc control assembly 730 can be configured and arranged to provide an electrical connection between the electronic LED disc signal routing assembly 732 and the electronic LED disc 702. As illustrated in FIG. 7, the electronic LED disc control assembly 730 can access the electrical connector 714 through the interlocking access shaft 740. In some embodiments, electronic LED disc control assembly 730 includes one or more connectors electrically connected to a printed circuit board (PCB) having various transmission lines, such as stripline or microstrip to provide some examples, to form electrical connections between the electronic LED disc signal routing assembly 732 and the electronic LED disc 702. In some embodiments, the one or more connectors can be implemented using a simple electrical board-to-board (BTB) connector such as a pin header or a box header; however, more complicated BTB connectors are possible as will be apparent to those skilled in the relevant art(s) without departing from the spirit and scope of the present disclosure.

The electronic LED disc signal routing assembly 732 can route various signals, such as power signals, control signals, and/or data signals to provide some examples, between the one or more communication cables 728 and the electronic LED disc control assembly 730. In the exemplary embodiment illustrated in FIG. 7, the electronic LED disc signal routing assembly 732 includes connectors 746.1 and 746.2 and a connector 748 to provide electrical connections between the one or more communication cables 728 and the electronic LED disc control assembly 730. As illustrated in FIG. 7, the one or more communication cables 728 can access the connectors 746.1 and 746.2 through the one or more openings, or holes, 738.1 and 738.2. In some embodiments, the electronic LED disc signal routing assembly 732 can route the various signals, such as power signals, control signals, and/or data signals to provide some examples, received by the connector 746.1 from a first communication cable from among the one or more communication cables 728 to the connector 748 for delivery to the electronic LED disc 702. In some embodiments, the electronic LED disc signal routing assembly 732 can route various signals, such as power signals, control signals, and/or data signals to provide some examples, received at the connector 748 to the connector 746.2 for delivery to a second communication cable from among the one or more communication cables 728. In some embodiments, the electronic LED disc signal routing assembly 732 can route the various signals, such as power signals, control signals, and/or data signals to provide some examples, received by the connector 746.1 from the first communication cable to the connector 746.2 for delivery to the second communication cable. In some embodiments, the connectors 746.1 and 746.2 and the connector 748 can be electrically connected to a printed circuit board (PCB) having various transmission lines, such as stripline or microstrip to provide some examples, to form electrical connections between the connectors 746.1 and 746.2 and/or the connector 748. In some embodiments, the connectors 746.1 and 746.2 and/or the connector 748 can be implemented using a simple electrical board-to-board (BTB) connector such as a pin header or a box header; however, more complicated BTB connectors are possible as will be apparent to those skilled in the relevant art(s) without departing from the spirit and scope of the present disclosure.

The mechanical cover 734 can be configured and arranged to mechanically secure the electronic LED disc control assembly 730 and the electronic LED disc signal routing assembly 732. As described above, the electronic LED disc control assembly 730 is mechanically and electrically connected to the electronic LED disc 702 via the interlocking access shaft 740. In some embodiments, the connector 748 can be mechanically and electrically connected to the electronic LED disc control assembly 730. In these embodiments, the electronic LED disc signal routing assembly 732 can be situated within an opening, or hole, in the electrical connection assembly 726. In some embodiments, the mechanical cover 734 can be connected to the electrical connection assembly 726 using various fasteners, such as nuts, screws, bolts, rivets, pins, and/or lags to provide some examples, to secure the electronic LED disc control assembly 730 and the electronic LED disc signal routing assembly 732 within the opening, or hole, in the electrical connection assembly 726.

Exemplary Method for Constructing the Exemplary Exterior Display System

Figure 8:
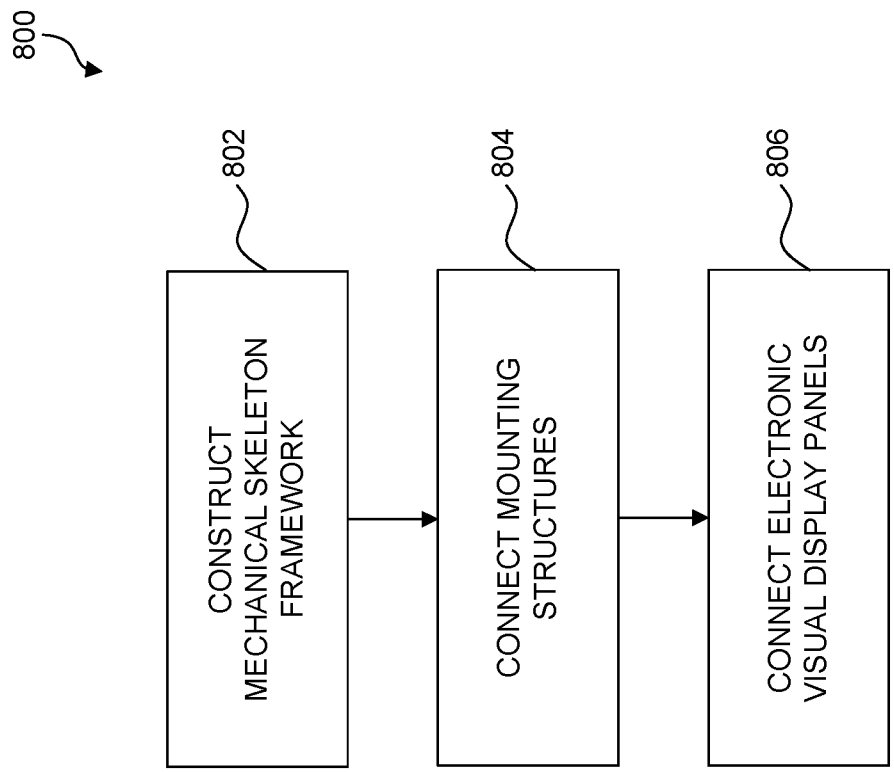

FIG. 8 illustrates a flowchart of an exemplary operation for constructing the exemplary exterior display system according to some embodiments of the disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 800 for constructing an exterior display system, such as the exterior display system 100 as described above in FIG. 1.

At operation 802, the exemplary operational control flow 800 constructs a mechanical skeleton framework. In some embodiments, the mechanical skeleton framework represents a load bearing structure which supports most of the weight of the exterior display system. The exemplary operational control flow 800 constructs horizontal supporting structures, such as the horizontal supporting structures 204.1 through 204.b as described above in FIG. 2A through FIG. 2D, around a building structure and/or a nonbuilding structure. The building structure and/or the nonbuilding structure can include, be connected to, and/or be surrounded by the horizontal supporting structures configured and arranged about its exterior surface or a portion of its exterior surface. In some embodiments, the exemplary operational control flow 800 can utilize temporary scaffolding to aid in the construction of the horizontal supporting structures. Thereafter, the exemplary operational control flow 800 connects vertical supporting structures, such as the vertical supporting structures 202.1 through 202.a as described above in FIG. 2A through FIG. 2D, to the horizontal supporting structures to create the mechanical skeleton framework. In some embodiments, the vertical supporting structures can be characterized as having a twist, such as, a clockwise twist to provide an example, to form the clockwise helical or swirl pattern as described above in FIG. 2A through FIG. 2D. In some embodiments, the vertical supporting structures are optional.

At operation 804, the exemplary operational control flow 800 connects mounting structures to the mechanical skeleton framework to form a mechanical supporting structure. The exemplary operational control flow 800 connects the mounting structures, such as the vertical mounting structures 206.1 through 206.c as described above in FIG. 2A through FIG. 2D, to the mechanical skeleton framework from operation 802 to form a mechanical supporting structure, such as the mechanical supporting structure 200 as described above in FIG. 2A through FIG. 2D. In some embodiments, the mounting structures can be characterized as having a twist, such as, a counterclockwise twist to provide an example, to form the counterclockwise helical or swirl pattern as described above in FIG. 2A through FIG. 2D.

At operation 806, the exemplary operational control flow 800 connects electronic visual display panels to the mechanical supporting structure to form the exterior display system. The exemplary operational control flow 800 connects the electronic visual display panels, such as the electronic visual display panels 302.1 through 302.n as described above in FIG. 3A through FIG. 3C, to the mechanical supporting structure from operation 804. In some embodiments, the exemplary operational control flow 800 can connect one or more adjustable mechanical mounting assemblies, such as the one or more adjustable mechanical mounting assemblies 416 as described above in FIG. 4, to the mechanical supporting structure from operation 804 and thereafter use the one or more adjustable mechanical mounting assemblies to connect the electronic visual display panels to the mechanical supporting structure. In some embodiments, orientations, for example, a pitch, a roll, and/or a yaw, of the electronic visual display panels in three-dimensional space can be adjusted by rotating mechanical cranks, such as the mechanical crank 432 as described above in FIG. 4, within the one or more adjustable mechanical mounting assemblies.

Exemplary Troubleshooting and/or Repairing of the Exterior Display System

Figure 9:
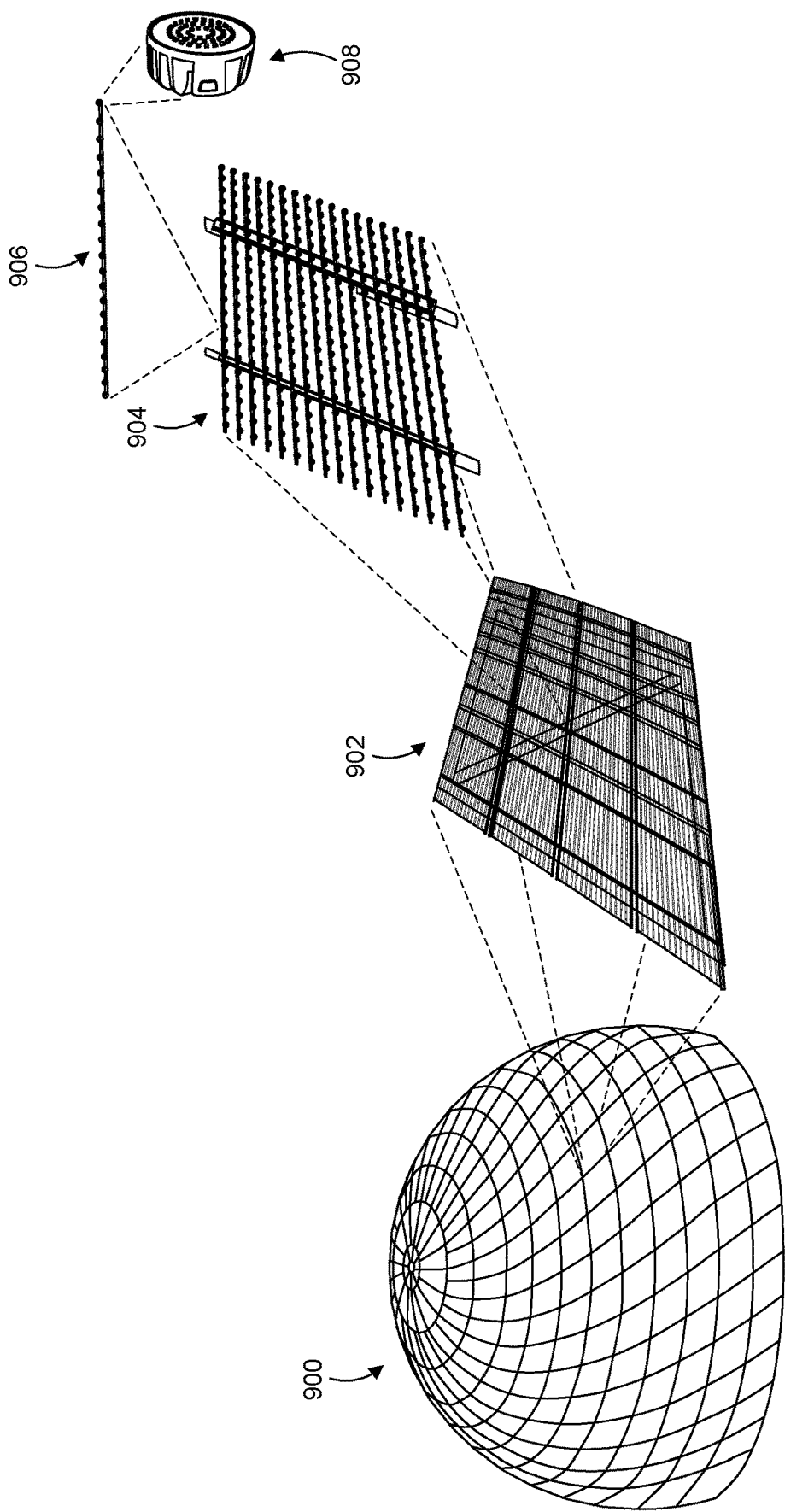

FIG. 9 graphically illustrates a perspective view of an exemplary embodiment of the exemplary exterior display system according to some embodiments of the disclosure. As illustrated in FIG. 9, an exterior display system 900 can include an electronic visual display panel 902 from among multiple electronic visual display panels that are connected to the mechanical supporting structure 200 to form the electronic visual display device 104 as described above in FIG. 2A through FIG. 2D and FIG. 3A through FIG. 3C. The exterior display system 900 and the electronic visual display panel 902 can represent exemplary embodiments of the exterior display system 100 as described above on FIG. 1 and the electronic visual display panel 530 as described above in FIG. 5C, respectively. Additionally, the electronic visual display panel 902 can include a modular display panel 904 from among multiple modular display panels. Further, the modular display panel 904 can include a row of electronic LED disc assemblies 906 from among multiple rows of electronic LED disc assemblies. Moreover, the row of electronic LED disc assemblies 906 can include an electronic LED disc assembly 908 from among multiple electronic LED disc assemblies. The modular display panel 904, the row of electronic LED disc assemblies 906, and the electronic LED disc assembly 908 can represent exemplary embodiments of the modular display panel 510 and/or the modular display panel 520 as described above in FIG. 5A and FIG. 5B, the row of electronic LED disc assemblies 600 as described above in FIG. 6, and one of the electronic LED disc assemblies 602.1 through 602.n as described above in FIG. 6, respectively.

In the exemplary embodiment illustrated in FIG. 9, the exterior display system 900 can be characterized as being a modular system with interchangeable panels, structures, and/or assemblies that ease the construction and/or the repair of the exterior display system 900. As illustrated in FIG. 9, the electronic visual display panel 902 can be connected to the mechanical supporting structure 200. In some embodiments, the electronic visual display panel 902 can be replaced by disconnecting a defective, failing, or failed electronic visual display panel from the mechanical supporting structure 200 and connecting a new electronic visual display panel to the mechanical supporting structure 200. In some embodiments, the electronic visual display panel 902 can be replaced when multiple modular display panels of the electronic visual display panel 902 are identified, or troubleshot, as being defective, failing, or failed. In some embodiments, the mechanical supporting structure 200 can include one or more adjustable mechanical mounting assemblies, such as the one or more adjustable mechanical mounting assemblies 416 as described above, to connect the electronic visual display panel 902 to the mechanical supporting structure 200. In these embodiments, one or more mounting clamps, such as the one or more mounting clamps 426 to provide an example, can be disengaged, for example, loosened, to remove the defective, failing, or failed electronic visual display panel from the mechanical supporting structure 200 and thereafter can be engaged, for example, tightened, to connect the new electronic visual display panel to the mechanical supporting structure 200.

As illustrated in FIG. 9, the modular display panel 904 can be replaced by disconnecting a defective, failing, or failed modular display panel from the electronic visual display panel 902 and connecting a new modular display panel to the electronic visual display panel 902. In some embodiments, the modular display panel 904 can be replaced when multiple rows of electronic LED disc assemblies of the modular display panel 904 are identified, or troubleshot, as being defective, failing, or failed. In some embodiments, the electronic visual display panel 902 can include one or more slots, grooves, and/or holes and the modular display panel 904 can include one or more corresponding slots, grooves, and/or holes. In these embodiments, one or more mechanical pins can be inserted into the slots, grooves, and/or holes of the electronic visual display panel 902 and the corresponding slots, grooves, and/or holes of the modular display panel 904 to connect the electronic visual display panel 902 and the modular display panel 904. In these embodiments, the one or more mechanical pins can be removed from these slots, grooves, and/or holes to disconnect the defective, failing, or failed modular display panel and the modular display panel 904 and thereafter the one or more mechanical pins can be inserted into inserted into the slots, grooves, and/or holes of the new modular display panel and the corresponding slots, grooves, and/or holes of the modular display panel 904 to connect the new modular display panel and the modular display panel 904.

As illustrated in FIG. 9, the row of electronic LED disc assemblies 906 can be replaced by disconnecting a defective, failing, or failed a row of electronic LED disc assemblies from the modular display panel 904 and connecting a new row of electronic LED disc assemblies to modular display panel 904. In some embodiments, the row of electronic LED disc assemblies 906 can be replaced when multiple electronic LED disc assemblies of the row of electronic LED disc assemblies 906 are identified, or troubleshot, as being defective, failing, or failed. In some embodiments, the modular display panel 904 and the row of electronic LED disc assemblies 906 can be configured and arranged to form the interlocking connectors as described above which are connected to one another by pushing the row of electronic LED disc assemblies 906 into the modular display panel 904. In these embodiments, the defective, failing, or failed row of electronic LED disc assemblies can be replaced by pulling the defective, failing, or failed row of electronic LED disc assemblies from the modular display panel 904 and pushing in the new row of electronic LED disc assemblies into the modular display panel 904.

As illustrated in FIG. 9, the electronic LED disc assembly 908 can be replaced by disconnecting a defective, failing, or failed electronic LED disc assembly from the row of electronic LED disc assemblies 906 and connecting a new electronic LED disc assembly to the row of electronic LED disc assemblies 906. In some embodiments, the electronic LED disc assembly 908 can be replaced when the electronic LED disc assembly 908 is identified, or troubleshot, as being defective, failing, or failed. In some embodiments, the row of electronic LED disc assemblies 906 and the electronic LED disc assembly 908 can be configured and arranged to form the interlocking connectors as described above which are connected to one another by pushing the electronic LED disc assembly 908 into the row of electronic LED disc assemblies 906. In some embodiments, the row of electronic LED disc assemblies 906 can include multiple mechanical LED disc mounts which can be connected to electronic LED disc assemblies by pushing the electronic LED disc assemblies into their corresponding mechanical LED disc mounts and/or disconnected from the electronic LED disc assemblies by pulling the electronic LED disc assemblies from their corresponding mechanical LED disc mounts. In some embodiments, the defective, failing, or failed electronic LED disc assembly can be replaced by pulling the defective, failing, or failed electronic LED disc assembly from the row of electronic LED disc assemblies 906 and pushing in the new electronic LED disc assembly into the row of electronic LED disc assemblies 906.

Exemplary Power and Data Systems within the Exterior Display System

As described above, the exterior display system 100 can be configured and arranged to present visual media 102, such as images, pictures, graphics, informational content, live images, moving images, videos, animations, advertisements, promotional content, movies, scenery, light displays and effects, among others. The discussion to follow is to describe a hierarchal power distribution system and/or a hierarchal data system that can be implemented within the exterior display system 100. As to be described in further detail below, the hierarchal power distribution system can distribute electric power to the multiple electronic visual display panels of the exterior display system 100. As to be described in further detail below, the hierarchal data system can distribute electronic data relating the visual media 102, or portions thereof, to be presented by the exterior display system 100.

Figure 10:
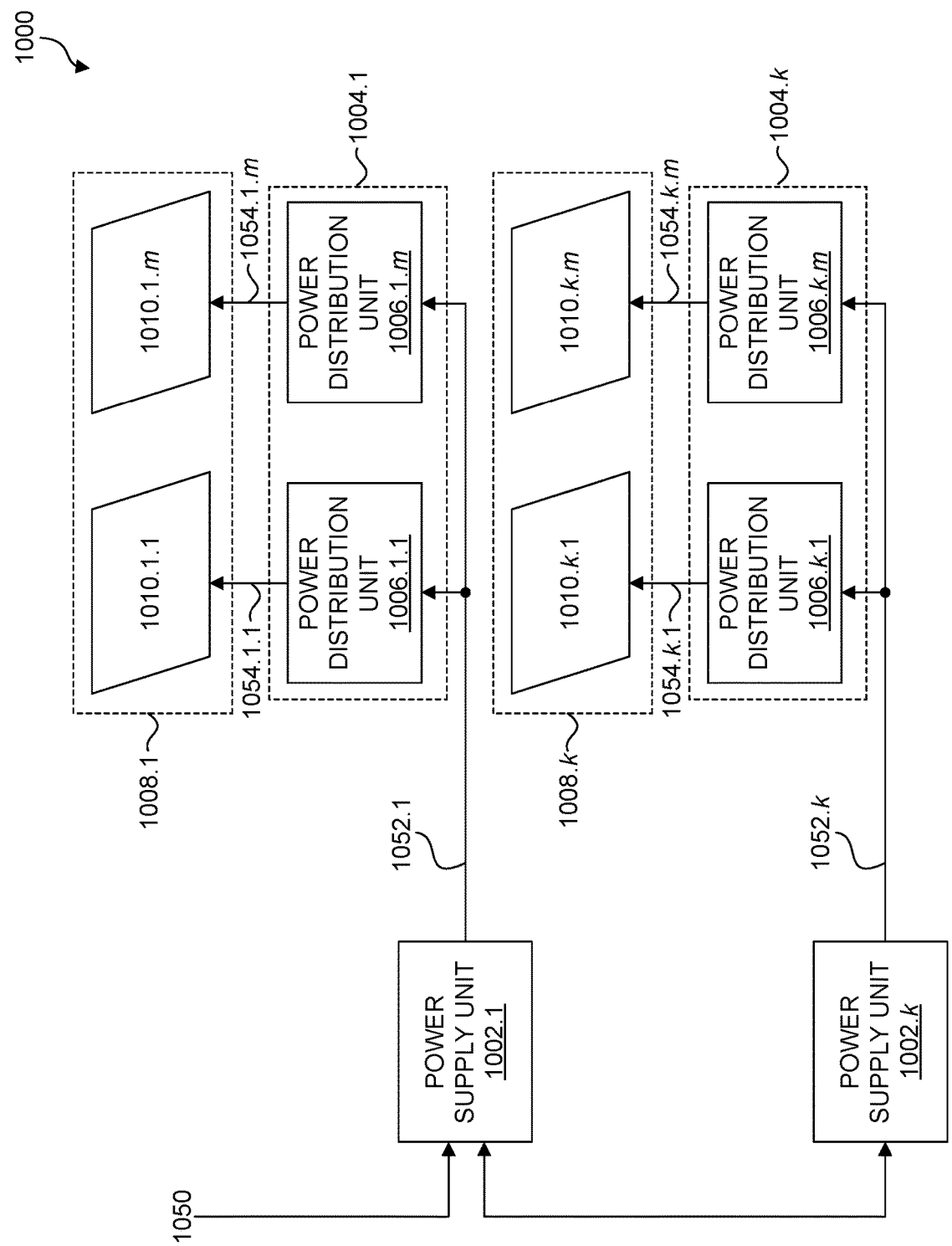
FIG. 10 illustrates a block diagram of a hierarchal power distribution system that can be implemented within the exemplary exterior display system according to some embodiments of the disclosure.

FIG. 10 illustrates a block diagram of a hierarchal power distribution system that can be implemented within the exemplary exterior display system according to some embodiments of the disclosure. In the exemplary embodiment illustrated in FIG. 10, a hierarchal power distribution system 1000 can distribute electric power throughout the exterior display system 100, for example, to multiple electronic visual display panels of the exterior display system 100. As described above in FIG. 3A through FIG. 3C, the multiple electronic visual display panels can be indexed as a series of sphere levels and/or a series of sphere bays. The sphere levels can traverse in horizontal directions for example, parallel to different x-y planes of the Cartesian coordinate system traversing from the base of the exterior display system 100 to the apex of the exterior display system 100. The sphere bays represent different vertical columns of the multiple electronic visual display panels along a vertical direction, for example, along the z-axis of the Cartesian coordinate system. As to be described in further detail below, the hierarchal power distribution system 1000 can distribute the electric power in the horizontal direction along these sphere levels and/or in the vertical direction along these sphere bays onto the multiple electronic visual display panels. In the exemplary embodiment illustrated in FIG. 10, the hierarchal power distribution system 1000 can include one or more power supply units (PSUs) 1002.1 through 1002.$k$, one or more groups of power distribution units 1004.1 through 1004.$k$, and/or one or more sections of electronic visual display panels 1008.1 through 1008.$k$.

In the exemplary embodiment illustrated in FIG. 10, the PSUs 1002.1 through 1002.$k$ generate the electric power for the exterior display system 100. As illustrated in FIG. 10, the PSUs 1002.1 through 1002.$k$ can be daisy chained to one another, namely, wired to another in sequence and/or in a ring to generate the electric power for the exterior display system 100. In some embodiments, the PSUs 1002.1 through 1002.$k$ can be characterized as being power source converters which covert an electric power 1050 that is delivered from one or more sources, such as the electric power grid via one or more electrical outlets, one or more energy storage devices such as one or more batteries or one or more fuel cells, one or more generators, one or more alternators, and/or other power supply units to provide some examples, to various voltages, currents, and/or frequencies to provide electric power 1052.1 through 1052.$k$ to the power distribution units 1006.1 through 1006.$m$. In some embodiments, the PSUs 1002.1 through 1002.$k$ can additionally, limit the electric power 1052.1 through 1052.$k$ to safe levels, shutting off one or more of the electric power 1052.1 through 1052.$k$ in the event of one or more electrical faults within the exterior display system 100, power condition the electric power 1052.1 through 1052.$k$ to prevent electronic noise or voltage surges from reaching the power distribution units 1006.1 through 1006.$m$, and/or power-factor correction. In some embodiments, the PSUs 1002.1 through 1002.$k$ can be implemented as one or more direct current (DC) power supplies, such as one or more alternating current (AC) to DC power supplies, one or more switched-mode power supplies, one or more capacitive, or transformerless, power supplies, and/or one or more linear regulators to provide some examples, one or more uninterruptible power supplies, one or more high-voltage power supplies, and/or any combination thereof to provide some examples.

In the exemplary embodiment illustrated in FIG. 10, the groups of power distribution units 1004.1 through 1004.$k$ can deliver electric power to their corresponding sections of electronic visual display panels from among the sections of electronic visual display panels 1008.1 through 1008.$k$. As illustrated in FIG. 10, the groups of power distribution units 1004.1 through 1004.$k$ can include power distribution units 1006.1.1 through 1006.$k.m$. Although each group of power distribution units from among the groups of power distribution units 1004.1 through 1004.$k$ is illustrated as including a similar number of power distribution units in FIG. 10, this is for illustrative purposes only. Those skilled in the relevant art(s) will recognize that each group of power distribution units from among the groups of power distribution units 1004.1 through 1004.*k* can include a different number of power distribution units from each another without departing from the spirit and scope of the present disclosure. Each group of power distribution units from among the groups of power distribution units 1004.1 through 1004.*k* can operate in a substantially similar manner to one another; therefore, only the group of power distribution units 1004.1 is to be described in further detail below.

As illustrated in FIG. 10, the group of power distribution units 1004.1 includes power distribution units 1006.1.1 through 1006.1.*m*. The power distribution units 1006.1.1 through 1006.1.*m* can convert the electric power 1052.1 into the other electric power 1054.1.1 through 1054.1.*m* that are suitable for the electronic visual display panels 1010.1.1 through 1010.1.*m*. In some embodiments, the power distribution units 1006.1.1 through 1006.1.*m* convert the electric power 1052.1 from a high power, for example, a high voltage and/or a high current, into the other electric power 1054.1.1 through 1054.1.*m* at lower powers, for example, lower voltages and/or lower currents. As illustrated in FIG. 10, the power distribution units 1006.1.1 through 1006.1.*m* can deliver their corresponding electric power from among the electric power 1052.1 through 1052.*k* to their corresponding sections of electronic visual display panels from among the sections of electronic visual display panels 1008.1 through 1008.*k*. In some embodiments, the power distribution units 1006.1.1 through 1006.1.*m* can additionally, limit the other electric power 1054.1.1 through 1054.1.*m* to safe levels, shutting off one or more of the other electric power 1054.1.1 through 1054.1.*m* in the event of one or more electrical faults within the exterior display system 100, power condition other electric power 1054.1.1 through 1054.1.*m* to prevent electronic noise or voltage surges from reaching the sections of electronic visual display panels 1008.1 through 1008.*k*, and/or power-factor correction. In some embodiments, the power distribution units 1006.1.1 through 1006.1.*m* can be implemented as one or more direct current (DC) power supplies, such as one or more alternating current (AC) to DC power supplies, one or more switched-mode power supplies, one or more capacitive, or transformerless, power supplies, and/or one or more linear regulators to provide some examples, one or more uninterruptible power supplies, one or more high-voltage power supplies, and/or any combination thereof to provide some examples.

In the exemplary embodiment illustrated in FIG. 10, the sections of electronic visual display panels 1008.1 through 1008.*k* can include visual display panels 1010.1.1 through 1010.*k.m*. Although each section of electronic visual display panels from among the sections of electronic visual display panels 1008.1 through 1008.*k* is illustrated as including a similar number of electronic visual display panels in FIG. 10, this is for illustrative purposes only. Those skilled in the relevant art(s) will recognize that each section of electronic visual display panels from among sections of electronic visual display panels 1008.1 through 1008.*k* can include a different number of electronic visual display panels from each another without departing from the spirit and scope of the present disclosure. Each section of electronic visual display panels from among the sections of electronic visual display panels 1008.1 through 1008.*k* can operate in a substantially similar manner to one another; therefore, only the section of electronic visual display panels 1008.1 is to be described in further detail below.

As illustrated in FIG. 10, the section of electronic visual display panels 1008.1 includes the electronic visual display panels 1010.1.1 through 1010.1.*m*. In the exemplary embodiment illustrated in FIG. 10, the electronic visual display panels 1010.1.1 through 1010.1.*m* can receive the electric power 1054.1.1 through 1054.1.*m* from the power distribution units 1006.1.1 through 1006.1.*m* over one or more copper cables, such as one or more coaxial cables, one or more ribbon cables, one or more shielded cables, and/or one or more twinax cables. In some embodiments, the electronic visual display panels 1010.1.1 through 1010.1.*m* can include electronic LED disc assemblies that are connected to one or more carrier rail structures, such as the carrier rail structures 504.1 through 504.*m* as described above in FIG. 5A through FIG. 5C. In these embodiments, electronic visual display panels 1010.1.1 through 1010.1.*m* can route the electric power 1054.1.1 through 1054.1.*m* to their carrier rail structures. In some embodiments, the electronic LED disc assemblies within the carrier rail structures can be daisy chained to one another, namely, wired to another in sequence and/or in a ring using one or more communication cables, such as the one or more communication cables 728 as described above in FIG. 7. In these embodiments, the one or more communication cables can be connected to the one or more copper cables to route the electric power 1054.1.1 through 1054.1.*m* to the electronic LED disc assemblies within their carrier rail structures. In some embodiments, one or more connectors of the one or more copper cables and one or more connectors of the one or more communication cables of the carrier rail structures can be configured and arranged to form the interlocking connectors as described above. These interlocking connectors can be connected to one another by pushing the one or more connectors of the one or more communication cables of the carrier rail structures into their corresponding one or more connectors of the one or more copper cables.

In some embodiments, each section of electronic visual display panels from among the sections of electronic visual display panels 1008.1 through 1008.*k* can correspond to a sphere bay, or a portion thereof, from among the sphere bays of the exterior display system 100, such as one or more of the sphere bays 306.1 through 306.*e* as described above in FIG. 3B, that transverses in the vertical direction. In these embodiments, the PSUs 1002.1 through 1002.*k* can be situated along one or more sphere levels, such one or more of the sphere levels 304.1 through 304.*d* as described above in FIG. 3B in the horizontal direction with the groups of power distribution units 1004.1 through 1004.*k* being situated along these sphere bays in the vertical direction to distribute the electric power to their corresponding sections of electronic visual display panels 1008.1 through 1008.*k*. Alternatively, or in addition to, each section of electronic visual display panels 1008.1 through 1008.*k* can correspond to a sphere level from among the sphere levels of the exterior display system 100, such as one or more of the sphere levels 304.1 through 304.*d* as described above in FIG. 3B, that transverses in the horizontal direction. In these embodiments, the PSUs 1002.1 through 1002.*k* can be situated along one or more sphere bays, such one or more of the sphere bays 306.1 through 306.*e* as described above in FIG. 3B in the vertical direction with the power distribution units 1006.1 through 1006.*m* being situated along these sphere levels in the horizontal direction to distribute the electric power to their sections of electronic visual display panels 1008.1 through 1008.*k*.

Figure 11:
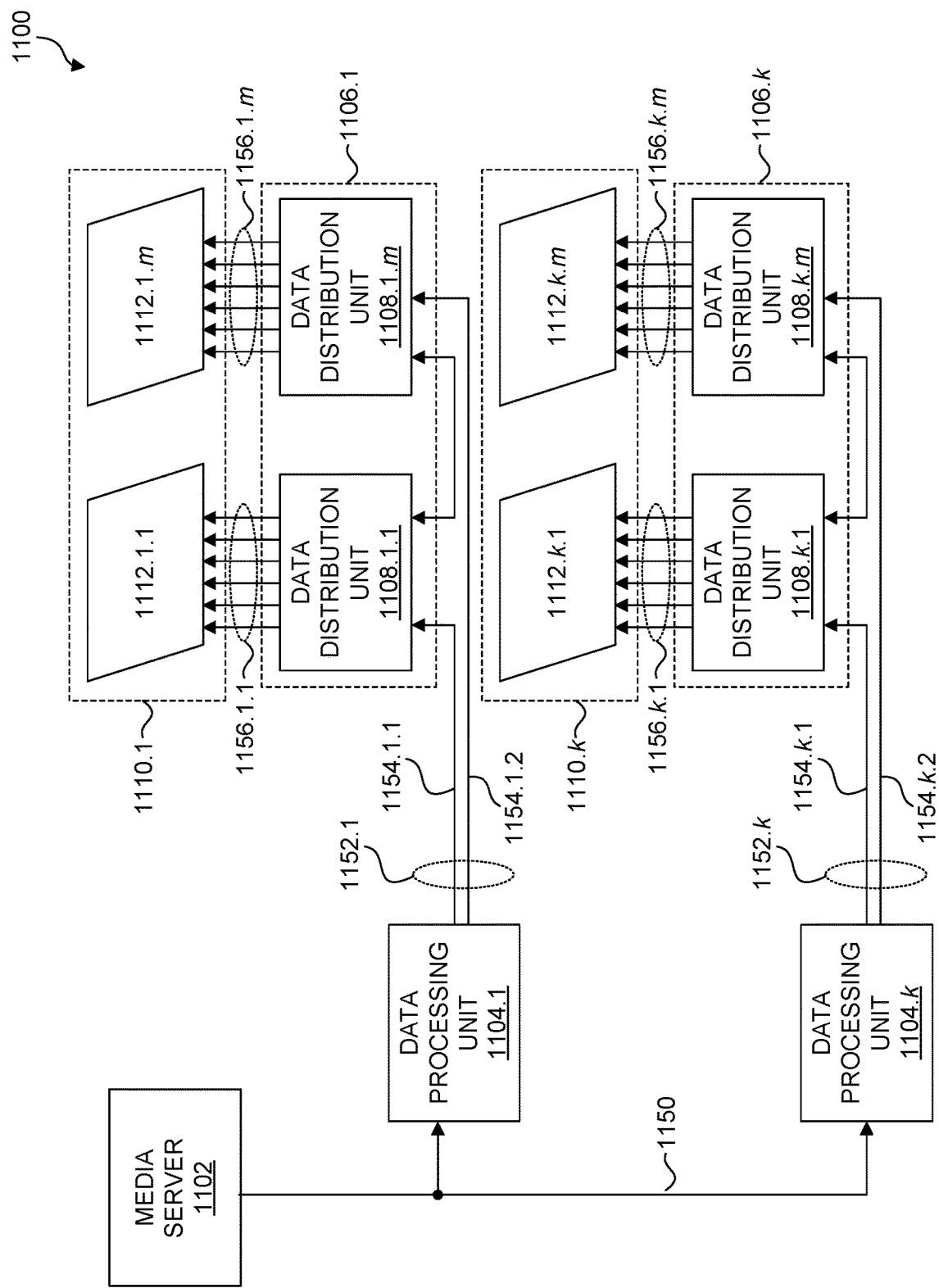
FIG. 11 illustrates a block diagram of a hierarchal data distribution system that can be implemented within the exemplary exterior display system according to some embodiments of the disclosure.

FIG. 11 illustrates a block diagram of a hierarchal data distribution system that can be implemented within the exemplary exterior display system according to some embodiments of the disclosure. In the exemplary embodiment illustrated in FIG. 11, a hierarchal data distribution system 1100 can distribute electronic data relating to visual media, such as images, pictures, graphics, informational content, live images, moving images, videos, animations, advertisements, promotional content, movies, scenery, light displays and effects, among others to provide some examples, to multiple electronic visual display panels of the exterior display system 100. As described above in FIG. 3A through FIG. 3C, the multiple electronic visual display panels can be indexed as a series of sphere levels and/or a series of sphere bays. The sphere levels can traverse in horizontal directions for example, parallel to different x-y planes of the Cartesian coordinate system traversing from the base of the exterior display system 100 to the apex of the exterior display system 100. The sphere bays represent different vertical columns of the multiple electronic visual display panels along a vertical direction, for example, along the z-axis of the Cartesian coordinate system. As to be described in further detail below, the hierarchal data distribution system 1100 can distribute the electronic data in the horizontal direction along these sphere levels and/or in the vertical direction along these sphere bays onto the multiple electronic visual display panels. In the exemplary embodiment illustrated in FIG. 11, the hierarchal data distribution system 1100 can include a media server 1102, data processing units 1104.1 through 1104.$k$, one or more groups of data distribution units 1106.1 through 1106.$k$, and sections of electronic visual display panels 1110.1 through 1110.$k$.

In the exemplary embodiment illustrated in FIG. 11, the media server 1102 represents a centralized media server for providing the visual media to be displayed by the exterior display system 100. In some embodiments, the media server 1102 can be situated within a dedicated control room of the building structure and/or the nonbuilding structure as described above in FIG. 1. In some embodiments, the media server 1102 can include one or more media repository systems for locally storing different visual media. In these embodiments, the media server 1102 can select the visual media from among the different visual media to be displayed by the exterior display system 100 and can thereafter retrieve the selected visual media from the one or more media repository systems. In some embodiments, the media server 1102 can receive the visual media from one or more remote media servers that are situated remotely from the building structure and/or the nonbuilding structure. In some embodiments, the media server 1102 can overlay one or more graphical images, such as one or more advertising logos, one or more advertisements, and/or one or more other graphical enhancements that will be recognized by those skilled in the relevant art(s) without departing from the spirit and scope of the present disclosure onto the visual media to provide some examples.

As illustrated in FIG. 11, the media server 1102 can process the visual media to provide one or more visual media data packets 1150 relating to the visual media. As part of this processing, the media server 1102 can parse the visual media into one or more logical sections of the visual media which can be displayed by one or more corresponding sections of electronic visual display panels from among sections of electronic visual display panels 1110.1 through 1110.$k$. After parsing the visual media, the media server 1102 can encapsulate or frame the one or more logical sections of the visual media into one or more payloads of the visual media data packets 1150 and/or append one or more identifiers, for example, one or more addresses of one or more data processing units from among the data processing units 1104.1 through 1104.$k$, within one or more headers of the visual media data packets 1150. In some embodiments, the media server 1102 can deliver the visual media data packets 1150 to the data processing units 1104.1 through 1104.$k$ over a wired communication network using, for example, one or more fiber-optic cables.

In the exemplary embodiment illustrated in FIG. 11, the data processing units 1104.1 through 1104.$k$ can deliver groups of elementary visual media data packets 1152.1 through 1152.$k$ to the groups of data distribution units 1106.1 through 1106.$k$. In some embodiments, the data processing units 1104.1 through 1104.$k$ can deliver the groups of elementary visual media data packets 1152.1 through 1152.$k$ to the groups of data distribution units 1106.1 through 1106.$k$ over the wired communication network using, for example, one or more Ethernet networking cables, such as one or more category 5 (Cat 5) or category 6 (Cat 6) Ethernet networking cables, and/or one or more copper core communication cables, such as one or more coaxial cables, one or more ribbon cables, one or more shielded cables, and/or one or more twinax cables. Moreover, as illustrated in FIG. 11, the groups of elementary visual media data packets 1152.1 through 1152.$k$ can include elementary visual media data packets 1154.1.1 through 1154.$k$.1 and elementary visual media data packets 1154.1.2 through 1154.$k$.2. In some embodiments, the elementary visual media data packets 1154.1.1 through 1154.$k$.1 are substantially similar to their corresponding visual media data packets 1154.1.2 through 1154.$k$.2. In these embodiments, the similarity between the elementary visual media data packets 1154.1.1 through 1154.$k$.1 and their corresponding visual media data packets 1154.1.2 through 1154.$k$.2 provides redundancy throughout the hierarchal data distribution system 1100 to mitigate errors, faults, and/or failures relating to the data distribution units 1106.1 through 1106.$m$ as to be described in further detail below. For example, the data processing units 1104.1 through 1104.$k$ can deliver the elementary visual media data packets 1154.1.1 through 1154.$k$.1 and elementary visual media data packets 1154.1.2 through 1154.$k$.2 to the groups of data distribution units 1106.1 through 1106.$k$ over multiple redundant data pathways.

In the exemplary embodiment illustrated in FIG. 11, the data processing units 1104.1 through 1104.$k$ can receive the one or more visual media data packets 1150 from the media server 1102. After receiving the one or more visual media data packets 1150, the data processing units 1104.1 through 1104.$k$ can process the one or more visual media data packets 1150 to generate the groups of elementary visual media data packets 1152.1 through 1152.$k$. As described above, the one or more visual media data packets 1150 can include one or more addresses of one or more data processing units from among the data processing units 1104.1 through 1104.$k$. In some embodiments, the data processing units 1104.1 through 1104.$k$ process those visual media data packets from among the one or more visual media data packets 1150 which correspond to their addresses and/or can disregard, or ignore, those visual media data packets from among the one or more visual media data packets 1150 which do not correspond to their addresses. In these embodiments, the data processing units 1104.1 through 1104.$k$ can temporarily store, or buffer, those visual media data packets from among the one or more visual media data packets 1150 which correspond to their addresses.

As part of this processing, the data processing units 1104.1 through 1104.$k$ can extract the one or more logical sections of the visual media from the one or more visual media data packets 1150. In some embodiments, the data processing units 1104.1 through 1104.*k* can parse the one or more logical sections of the visual media into one or more elementary sections of the visual media which can be displayed by one or more electronic visual display panels 1112.1.1 through 1112.*k.m* as to be described in further detail below. After parsing the one or more logical sections, the data processing units 1104.1 through 1104.*k* can encapsulate or frame the one or more elementary sections of the visual media into one or more payloads of the groups of sectional visual media data packets 1152.1 through 1152.*k* and/or append one or more identifiers, for example, one or more addresses of one or more data distribution units from among data distribution units 1108.1.1 through 1108.*k.m*, within one or more headers of the groups of elementary visual media data packets 1152.1 through 1152.*k*. In some embodiments, the data processing units 1104.1 through 1104.*k* can encapsulate or frame the one or more elementary sections of the visual media into the one or more payloads of the sectional visual media data packets 1154.1.1 through 1154.*k*.1 and/or append the one or more identifiers within one or more headers of the sectional visual media data packets 1154.1.1 through 1154.*k*.1. In these embodiments, the data processing units 1104.1 through 1104.*k* can generate the sectional visual media data packets 1154.1.2 through 1154.*k*.2 in a substantially similar manner as the sectional visual media data packets 1154.1.1 through 1154.*k*.1 and/or the data processing units 1104.1 through 1104.*k* can copy of the sectional visual media data packets 1154.1.1 through 1154.*k*.1 to generate their corresponding sectional visual media data packets 1154.1.2 through 1154.*k*.2.

In the exemplary embodiment illustrated in FIG. 11, the groups of data distribution units 1106.1 through 1106.*k* can deliver electronic visual display panel control signals 1156.1.1 through 1156.*k.m* to their corresponding sections of electronic visual display panels 1110.1 through 1110.*k*. As illustrated in FIG. 11, the groups of data distribution units 1106.1 through 1106.*k* can include data distribution units 1108.1.1 through 1108.*k.m*. Although each group of data distribution units from among the groups of data distribution units 1106.1 through 1106.*k* is illustrated as including a similar number of data distribution units in FIG. 11, this is for illustrative purposes only. Those skilled in the relevant art(s) will recognize that each group of data distribution units from among the groups of data distribution units 1106.1 through 1106.*k* can include a different number of data distribution units from each another without departing from the spirit and scope of the present disclosure. Each group of data distribution units from among the groups of data distribution units 1106.1 through 1106.*k* can operate in a substantially similar manner to one another; therefore, only the group of data distribution units 1106.1 is to be described in further detail below.

As illustrated in FIG. 11, the group of data distribution units 1106.1 includes data distribution units 1108.1.1 through 1108.1.*m*. In the exemplary embodiment illustrated in FIG. 11, the data distribution units 1108.1.1 through 1108.1.*m* receive into the group of elementary visual media data packets 1152.1 from the data processing unit 1104.1. As illustrated in FIG. 11, the data distribution units 1108.1.1 through 1108.1.*m* can be daisy chained to one another, namely, wired to another in sequence and/or in a ring. In some embodiments, the data distribution units 1108.1.1 through 1108.1.*m* can receive the sectional visual media data packets 1154.1.1 over a first data pathway and the sectional visual media data packets 1154.1.2 over a second data pathway. Generally, each of the data distribution units 1108.1.1 through 1108.1.*m* can receive the sectional visual media data packets 1154.1.1 over the first data pathway and the sectional visual media data packets 1154.1.2 over the first data pathway. However, in some situations, one or more errors, faults, and/or failures within the data distribution units 1108.1.1 through 1108.1.*m* can prevent one or more data distribution units from among the data distribution units 1108.1.1 through 1108.1.*m* from receiving the sectional visual media data packets 1154.1.1 over the first data pathway. In these situations, these one or more data distribution units can receive the sectional visual media data packets 1154.1.2 over the second data pathway. In some embodiments, the data processing units 1104.1 through 1104.*k* can append one or more identifiers, such as one or more sequence numbers to provide an example, to the sectional visual media data packets 1154.1.1 and the sectional visual media data packets 1154.1.2. In these embodiments, the data distribution units 1108.1.1 through 1108.1.*m* can compare the one or more identifiers of each received sectional visual media data packet 1154.1.1 and each received sectional visual media data packet 1154.1.2 with other identifiers of previously received sectional visual media data packets to determine whether each received sectional visual media data packet 1154.1.1 and each received sectional visual media data packet 1154.1.2 is a new sectional visual media data packet or a copy of a previously received sectional visual media data packet. In these embodiments, the data distribution units 1108.1.1 through 1108.1.*m* can disregard, or ignore, those sectional visual media data packets from among the group of elementary visual media data packets 1152.1 which have been previously received.

After receiving the group of elementary visual media data packets 1152.1, the data distribution units 1108.1.1 through 1108.1.*m* can process the group of elementary visual media data packets 1152.1 to generate the electronic visual display panel control signals 1156.1.1 through 1156.1.*m*. As described above, the group of elementary visual media data packets 1152.1 can include one or more addresses of one or more distribution units from among the data distribution units 1108.1.1 through 1108.1.*m*. In some embodiments, the data distribution units 1108.1.1 through 1108.1.*m* process those elementary visual media data packets from among the group of elementary visual media data packets 1152.1 which correspond to their addresses and/or can disregard, or ignore, those elementary visual media data packets from among the group of elementary visual media data packets 1152.1 which do not correspond to their addresses. In these embodiments, the distribution units 1108.1.1 through 1108.1.*m* can temporarily store, or buffer, those elementary visual media data packets from among the group of elementary visual media data packets 1152.1 which correspond to their addresses.

As part of this processing, the data distribution units 1108.1.1 through 1108.1.*m* can extract the one or more elementary sections of the visual media from the group of elementary visual media data packets 1152.1. As illustrated in FIG. 11, the data distribution units 1108.1.1 through 1108.1.*m* can thereafter convert the one or more elementary sections into the visual display panel control signals 1156.1.1 through 1156.1.*m* that correspond to the section of electronic visual display panels 1110.1. In these embodiments, the data distribution units 1108.1.1 through 1108.1.*m* can convert the one or more elementary sections of the visual media into suitable control signals, such as suitable voltages and/or suitable currents to provide some example, to cause the section of electronic visual display panels 1110.1 to display one or more images representative of the one or more elementary sections of the visual media from the group of elementary visual media data packets 1152.1.

In the exemplary embodiment illustrated in FIG. 11, the sections of electronic visual display panels 1110.1 through 1110.k can include visual display panels 1112.1.1 through 1112.k.m. Although each section of electronic visual display panels from among the sections of electronic visual display panels 1110.1 through 1110.k illustrated as including a similar number of electronic visual display panels in FIG. 11, this is for illustrative purposes only. Those skilled in the relevant art(s) will recognize that each section of electronic visual display panels from among sections of electronic visual display panels 1110.1 through 1110.k can include a different number of electronic visual display panels from each another without departing from the spirit and scope of the present disclosure. Each section of electronic visual display panels from among the sections of electronic visual display panels 1110.1 through 1110.k can operate in a substantially similar manner to one another; therefore, only the section of electronic visual display panels 1110.1 is to be described in further detail below.

As illustrated in FIG. 11, the section of electronic visual display panels 1110.1 includes the electronic visual display panels 1112.1.1 through 1112.1.m. In the exemplary embodiment illustrated in FIG. 11, the electronic visual display panels 1112.1.1 through 1112.1.m can receive the visual display panel control signals 1156.1.1 through 1156.1.m from the data distribution units 1108.1.1 through 1108.1.m over one or more copper cables, such as one or more coaxial cables, one or more ribbon cables, one or more shielded cables, and/or one or more twinax cables. In some embodiments, the electronic visual display panels 1112.1.1 through 1112.1.m can include electronic LED disc assemblies that are connected to one or more carrier rail structures, such as the carrier rail structures 504.1 through 504.m as described above in FIG. 5A through FIG. 5C. In these embodiments, electronic visual display panels 1112.1.1 through 1112.1.m can route the visual display panel control signals 1156.1.1 through 1156.1.m to their carrier rail structures. In some embodiments, the electronic LED disc assemblies within the carrier rail structures can be daisy chained to one another, namely, wired to another in sequence and/or in a ring using one or more communication cables, such as the one or more communication cables 728 as described above in FIG. 7. In these embodiments, the one or more communication cables can be connected to the one or more copper cables to route the visual display panel control signals 1156.1.1 through 1156.1.m to the electronic LED disc assemblies within their carrier rail structures. In some embodiments, one or more connectors of the one or more copper cables and one or more connectors of the one or more communication cables of the carrier rail structures can be configured and arranged to form the interlocking connectors as described above. These interlocking connectors can be connected to one another by pushing the one or more connectors of the one or more communication cables of the carrier rail structures into their corresponding one or more connectors of the one or more copper cables.

In some embodiments, each section of electronic visual display panels from among the sections of electronic visual display panels 1110.1 through 1110.k can correspond to a sphere bay, or a portion thereof, from among the sphere bays of the exterior display system 100, such as one or more of the sphere bays 306.1 through 306.e as described above in FIG. 3B, that transverses in the vertical direction. In these embodiments, the data processing units 1104.1 through 1104.k can be situated along one or more sphere levels, such one or more of the sphere levels 304.1 through 304.d as described above in FIG. 3B in the horizontal direction with the groups of data distribution units 1106.1 through 1106.k being situated along these sphere bays in the vertical direction to distribute the visual display panel control signals 1156.1.1 through 1156.1.m to their corresponding sections of electronic visual display panels 1110.1 through 1110.k. Alternatively, or in addition to, each section of electronic visual display panels 1110.1 through 1110.k can correspond to a sphere level from among the sphere levels of the exterior display system 100, such as one or more of the sphere levels 304.1 through 304.d as described above in FIG. 3B, that transverses in the horizontal direction. In these embodiments, the data processing units 1104.1 through 1104.k can be situated along one or more sphere bays, such one or more of the sphere bays 306.1 through 306.e as described above in FIG. 3B in the vertical direction with the groups of data distribution units 1106.1 through 1106.k being situated along these sphere levels in the horizontal direction to distribute the visual display panel control signals 1156.1.1 through 1156.1.m to their corresponding sections of electronic visual display panels 1110.1 through 1110.k.

FIG. 12 illustrates a block diagram of a hierarchal power and data distribution system that can be implemented within the exemplary exterior display system according to some embodiments of the disclosure. In the exemplary embodiment illustrated in FIG. 12, a hierarchal power and data distribution system 1200 can distribute electric power throughout the exterior display system 100, for example, to multiple electronic visual display panels of the exterior display system 100 and/or electronic data relating to visual media, such as images, pictures, graphics, informational content, live images, moving images, videos, animations, advertisements, promotional content, movies, scenery, light displays and effects, among others to provide some examples, to the multiple electronic visual display panels. As described above in FIG. 3A through FIG. 3C, the multiple electronic visual display panels can be indexed as a series of sphere levels and/or a series of sphere bays. The sphere levels can traverse in horizontal directions for example, parallel to different x-y planes of the Cartesian coordinate system traversing from the base of the exterior display system 100 to the apex of the exterior display system 100. The sphere bays represent different vertical columns of the multiple electronic visual display panels along a vertical direction, for example, along the z-axis of the Cartesian coordinate system. As to be described in further detail below, the hierarchal power distribution system 1200 can distribute the electric power and/or the electronic data in the horizontal direction along these sphere levels and/or in the vertical direction along these sphere bays onto the multiple electronic visual display panels. In the exemplary embodiment illustrated in FIG. 12, the hierarchal power distribution system 1200 can include the one or more power supply units (PSUs) 1002.1 through 1002.k, the data processing units 1104.1 through 1104.k, one or more groups of power and data distribution units 1202.1 through 1202.k, and/or one or more sections of electronic visual display panels 1206.1 through 1206.k. The PSUs 1002.1 through 1002.k and the data processing units 1104.1 through 1104.k have been described above in FIG. 10 and FIG. 11, respectively, and will not be described in further detail below.

In the exemplary embodiment illustrated in FIG. 12, the groups of power and data distribution units 1202.1 through 1202.k can deliver electronic visual display panel power and control signals 1250.1.1 through 1250.k.m to their corresponding sections of electronic visual display panels 1206.1 through 1206.k. As illustrated in FIG. 12, the groups of power and data distribution units 1202.1 through 1202.k can include power and data distribution units 1208.1.1 through 1208.k.m. Although each group of power and data distribution units from among the groups of power and data distribution units 1202.1 through 1202.k is illustrated as including a similar number of power and data distribution units in FIG. 12, this is for illustrative purposes only. Those skilled in the relevant art(s) will recognize that each group of power and data distribution units from among the groups of power and data distribution units 1202.1 through 1202.k can include a different number of power and data distribution units from each another without departing from the spirit and scope of the present disclosure. Each group of power and data distribution units from among the groups of power and data distribution units 1202.1 through 1202.k can operate in a substantially similar manner to one another; therefore, only the group of power and data distribution units 1202.1 is to be described in further detail below.

As illustrated in FIG. 12, the group of power and data distribution units 1202.1 includes power and data distribution units 1208.1.1 through 1208.1.m. In the exemplary embodiment illustrated in FIG. 12, the power and data distribution units 1208.1.1 through 1208.1.m can receive into the group of elementary visual media data packets 1152.1 from the data processing unit 1104.1 in a substantially similar manner as the data distribution units 1108.1.1 through 1108.1.m as described above in FIG. 11. After receiving the group of elementary visual media data packets 1152.1, the power and data distribution units 1208.1.1 through 1208.1.m can process the group of elementary visual media data packets 1152.1 to generate electronic visual display panel power and control signals 1250.1.1 through 1250.1.m in a substantially similar manner as the data distribution units 1108.1.1 through 1108.1.m as described above in FIG. 11. Moreover, the power and data distribution units 1208.1.1 through 1208.1.m convert the electric power 1052.1 into other electric power that are suitable for the section of electronic visual display panels 1206.1 in a substantially similar manner as the power distribution units 1006.1.1 through 1006.1.m as described above in FIG. 10. The power and data distribution units 1208.1.1 through 1208.1.m can include these other electric power within the electronic visual display panel power and control signals 1250.1.1 through 1250.1.m.

In the exemplary embodiment illustrated in FIG. 12, the sections of electronic visual display panels 1206.1 through 1206.k can include visual display panels 1208.1.1 through 1208.k.m. Although each section of electronic visual display panels from among the sections of electronic visual display panels 1206.1 through 1206.k illustrated as including a similar number of electronic visual display panels in FIG. 12, this is for illustrative purposes only. Those skilled in the relevant art(s) will recognize that each section of electronic visual display panels from among sections of electronic visual display panels 1206.1 through 1206.k can include a different number of electronic visual display panels from each another without departing from the spirit and scope of the present disclosure. Each section of electronic visual display panels from among the sections of electronic visual display panels 1206.1 through 1206.k can operate in a substantially similar manner to one another; therefore, only the section of electronic visual display panels 1206.1 is to be described in further detail below.

As illustrated in FIG. 12, the section of electronic visual display panels 1206.1 includes the electronic visual display panels 1208.1.1 through 1208.1.m. In the exemplary embodiment illustrated in FIG. 12, the electronic visual display panels 1208.1.1 through 1208.1.m can receive the visual display panel power and control signals 1250.1.1 through 1250.1.m from the power and data distribution units 1208.1.1 through 1208.1.m over one or more copper cables, such as one or more coaxial cables, one or more ribbon cables, one or more shielded cables, and/or one or more twinax cables. In some embodiments, the electronic visual display panels 1208.1.1 through 1208.1.m can include electronic LED disc assemblies that are connected to one or more carrier rail structures, such as the carrier rail structures 504.1 through 504.m as described above in FIG. 5A through FIG. 5C. In these embodiments, electronic visual display panels 1208.1.1 through 1208.1.m can route the visual display panel power and control signals 1250.1.1 through 1250.1.m to their carrier rail structures. In some embodiments, the electronic LED disc assemblies within the carrier rail structures can be daisy chained to one another, namely, wired to another in sequence and/or in a ring using one or more communication cables, such as the one or more communication cables 728 as described above in FIG. 7. In these embodiments, the one or more communication cables can be connected to the one or more copper cables to route the visual display panel power and control signals 1250.1.1 through 1250.1.m to the electronic LED disc assemblies within their carrier rail structures. In some embodiments, one or more connectors of the one or more copper cables and one or more connectors of the one or more communication cables of the carrier rail structures can be configured and arranged to form the interlocking connectors as described above. These interlocking connectors can be connected to one another by pushing the one or more connectors of the one or more communication cables of the carrier rail structures into their corresponding one or more connectors of the one or more copper cables.

In some embodiments, each section of electronic visual display panels from among the sections of electronic visual display panels 1206.1 through 1206.k can correspond to a sphere bay, or a portion thereof, from among the sphere bays of the exterior display system 100, such as one or more of the sphere bays 306.1 through 306.e as described above in FIG. 3B, that transverses in the vertical direction. In these embodiments, the PSUs 1002.1 through 1002.k and/or the data processing units 1104.1 through 1104.k can be situated along one or more sphere levels, such one or more of the sphere levels 304.1 through 304.d as described above in FIG. 3B in the horizontal direction with the groups of power data distribution units 1202.1 through 1202.k being situated along these sphere bays in the vertical direction to distribute the electronic visual display panel power and control signals 1250.1.1 through 1250.k.m to their corresponding sections of electronic visual display panels 1206.1 through 1206.k. Alternatively, or in addition to, each section of electronic visual display panels 1206.1 through 1206.k can correspond to a sphere level from among the sphere levels of the exterior display system 100, such as one or more of the sphere levels 304.1 through 304.d as described above in FIG. 3B, that transverses in the horizontal direction. In these embodiments, the PSUs 1002.1 through 1002.k and/or the data processing units 1104.1 through 1104.k can be situated along one or more sphere bays, such one or more of the sphere bays 306.1 through 306.e as described above in FIG. 3B in the vertical direction with the groups of power data distribution units 1202.1 through 1202.k being situated along these sphere levels in the horizontal direction to distribute the electronic visual display panel power and control signals 1250.1.1 through 1250.k.m to their corresponding sections of electronic visual display panels 1206.1 through 1206.k.

Exemplary Computer System that can be Utilized to Implement Electronic Devices within the Exemplary Exterior Display System FIG. 13 graphically illustrates a simplified block diagram of a computer system suitable for use with embodiments described herein according to some exemplary embodiments of the present disclosure. The various electronic devices, for example, the data processing units 1104.1 through 1104.k, the one or more groups of data distribution units 1106.1 through 1106.k, and/or the one or more groups of power and data distribution units 1202.1 through 1202.k, can be implemented in hardware, firmware, software, or any combination thereof. The discussion of FIG. 13 to follow describes an exemplary computer system 1310 that can be used for these electronic devices.

In the exemplary embodiment illustrated in FIG. 13, the computer system 1310 typically includes at least one processor 1314 which communicates with a number of peripheral devices via bus subsystem 1312. Typically, the at least processor 1314 can include, or can be, any of a microprocessor, graphics processing unit, or digital signal processor, and their electronic processing equivalents, such as an Application Specific Integrated Circuit ("ASIC") or Field Programmable Gate Array ("FPGA"). As used herein, the term "processor" signifies a tangible data and information processing device that physically transforms data and information, typically using a sequence transformation (also referred to as "operations"). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements. The processor can be electronic, for example, comprising digital logic circuitry (for example, binary logic), or analog (for example, an operational amplifier). The processor may also operate to support performance of the relevant operations in a "cloud computing" environment or as a "software as a service" (SaaS). For example, at least some of the operations may be performed by a group of processors available at a distributed or remote system, these processors accessible via a communications network (e.g., the Internet) and via one or more software interfaces (e.g., an application program interface (API).)

The computer system typically includes an operating system, such as Microsoft's Windows, Sun Microsystems's Solaris, Apple Computer's MacOs, Linux or UNIX. The computer system also typically can include a Basic Input/Output System (BIOS) and processor firmware. The operating system, BIOS and firmware are used by the processor to control subsystems and interfaces coupled to the processor. Typical processors compatible with these operating systems include the Pentium and Itanium from Intel, the Opteron and Athlon from Advanced Micro Devices, and the ARM processor from ARM Holdings.

As illustrated in FIG. 13, these peripheral devices may include a storage subsystem 1324, comprising a memory subsystem 1326 and a file storage subsystem 1328, user interface input devices 1322, user interface output devices 1320, and a network interface subsystem 1316. The input and output devices allow user interaction with computer system 1310. In the exemplary embodiment illustrated in FIG. 13, the network interface subsystem 1316 provides an interface to outside networks, including an interface to a communication network 1318, and is coupled via a communication network 1318 to corresponding interface devices in other computer systems or machines. The communication network 1318 may comprise many interconnected computer systems, machines and communication links. These communication links may be wired links, optical links, wireless links, or any other devices for communication of information. The communication network 1318 can be any suitable computer network, for example a wide area network such as the Internet, and/or a local area network such as Ethernet. The communication network 1318 can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

The user interface input devices 1322 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into the computer system 1310 or onto the communication network 1318. The user interface input devices 1322 typically allow a user to select objects, icons, text and the like that appear on some types of user interface output devices, for example, a display subsystem.

The user interface output devices 1320 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from the computer system 1310 to the user or to another machine or computer system.

The memory subsystem 1326 typically includes a number of memories including a main random-access memory ("RAM") 1330 (or other volatile storage device) for storage of instructions and data during program execution and a read only memory ("ROM") 1332 in which fixed instructions are stored. The file storage subsystem 1328 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1328.

The bus subsystem 1312 provides a device for letting the various components and subsystems of the computer system 1310 communicate with each other as intended. Although the bus subsystem 1312 is shown schematically as a single bus, alternative embodiments of the bus subsystem may use multiple busses. For example, RAM-based main memory can communicate directly with file storage systems using Direct Memory Access ("DMA") systems.

CONCLUSION

The Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The Detailed Description is not meant to limiting. Rather, the scope of the disclosure is defined only in accordance with the following claims and their equivalents. It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the following claims and their equivalents in any way.

The exemplary embodiments described within the disclosure have been provided for illustrative purposes and are not intended to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software application, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software application, routines, instructions can be described herein as performing certain actions. However, it should be appreciated that such descriptions are merely for convenience and that such actions in fact result from computing devices, processors, controllers, or other devices executing the firmware, software application, routines, instructions, etc.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A carrier rail structure for presenting visual media, comprising:
    a mechanical carrier rail structure;
    a plurality of light-emitting diode (LED) assemblies configured to present the visual media, the plurality of LED assemblies being configured and arranged along the mechanical carrier rail structure, each LED assembly from among the plurality of LED assemblies including a group of LEDs from among a plurality of groups of a plurality of LEDs; and
    a plurality of mechanical LED disc mounts configured to secure the plurality of LED assemblies to the mechanical carrier rail structure, the plurality of mechanical LED disc mounts and the plurality of LED assemblies being configured and arranged to form a plurality of interlocking connectors to secure the plurality of LED assemblies to the mechanical carrier rail structure by rotating the plurality of mechanical LED disc mounts.

2. The carrier rail structure of claim 1, wherein the mechanical carrier rail structure is configured to arrange the plurality of mechanical LED disc mounts in a horizontal direction.

3. The carrier rail structure of claim 1, wherein each mechanical LED disc mount from among the plurality of mechanical LED disc mounts is equidistant to one another along the mechanical carrier rail structure.

4. The carrier rail structure of claim 3, wherein a center-to-center distance between adjacent mechanical LED disc mounts from among the plurality of mechanical LED disc mounts is within a range between approximately 100 millimeters (mm) to approximately 300 mm, between approximately 150 mm to approximately 275 mm, or between approximately 200 mm to approximately 250 mm.

5. The carrier rail structure of claim 1, wherein the visual media comprises a plurality of pixels, and
    wherein each LED assembly from among the plurality of LED assemblies is configured to provide a corresponding pixel from among the plurality of pixels.

6. The carrier rail structure of claim 1, wherein LEDs from among the group of LEDs are configured and arranged to be a concentric circle of LEDs, a concentric rectangle of LEDs, a concentric square of LEDs, or a concentric polygon of LEDs.

7. The carrier rail structure of claim 1, wherein the mechanical carrier rail structure comprises a plurality of openings corresponding to the plurality of mechanical LED disc mounts,
    wherein the plurality of mechanical LED disc mounts comprise a plurality of interlocking screw assemblies, wherein the carrier rail structure further comprises a plurality of electrical connection assemblies configured to slide through corresponding openings from among the plurality of openings to expose corresponding interlocking screw protrusions from among a plurality of interlocking screw protrusions, and wherein the plurality of mechanical LED disc mounts are configured to be mechanically secured to the mechanical carrier rail structure by rotating the plurality of interlocking screw assemblies about the plurality of interlocking screw protrusions.

8. The carrier rail structure of claim 7, wherein the plurality of electrical connection assemblies comprises a plurality of connectors to communicatively couple the plurality of LED assemblies to one another.

9. The carrier rail structure of claim 1, wherein the plurality of mechanical LED disc mounts is configured to be mechanically secured to the mechanical carrier rail structure by rotating the plurality of mechanical LED disc mounts about the mechanical carrier rail structure.

10. A carrier rail structure, comprising:
a mechanical carrier rail structure; and
a plurality of mechanical light-emitting diode (LED) disc mounts configured to secure a plurality of LED assemblies to the mechanical carrier rail structure, the plurality of mechanical LED disc mounts and the plurality of LED assemblies being configured and arranged to form a plurality of interlocking connectors to secure the plurality of LED assemblies to the mechanical carrier rail structure by pushing the plurality of LED assemblies into their corresponding mechanical LED disc mounts from among the plurality of mechanical LED disc mounts and rotating the plurality of mechanical LED disc mounts.

11. The carrier rail structure of claim 10, wherein the mechanical carrier rail structure is configured to arrange the plurality of mechanical LED disc mounts in a horizontal direction.

12. The carrier rail structure of claim 10, wherein each mechanical LED disc mount from among the plurality of mechanical LED disc mounts is equidistant to one another along the mechanical carrier rail structure.

13. The carrier rail structure of claim 12, wherein a center-to-center distance between adjacent mechanical LED disc mounts from among the plurality of mechanical LED disc mounts is within a range between approximately 100 millimeters (mm) to approximately 300 mm, between approximately 150 mm to approximately 275 mm, or between approximately 200 mm to approximately 250 mm.

14. The carrier rail structure of claim 10, wherein the mechanical carrier rail structure comprises a plurality of openings corresponding to the plurality of mechanical LED disc mounts, wherein the plurality of mechanical LED disc mounts comprise a plurality of interlocking screw assemblies, wherein the carrier rail structure further comprises a plurality of electrical connection assemblies configured to slide through corresponding openings from among the plurality of openings to expose corresponding interlocking screw protrusions from among a plurality of interlocking screw protrusions, and wherein the plurality of mechanical LED disc mounts are configured to be mechanically secured to the mechanical carrier rail structure by rotating the plurality of interlocking screw assemblies about the plurality of interlocking screw protrusions.

15. The carrier rail structure of claim 14, wherein the plurality of electrical connection assemblies comprises a plurality of connectors to communicatively couple the plurality of LED assemblies to one another.

16. The carrier rail structure of claim 10, wherein the plurality of mechanical LED disc mounts is configured to be mechanically secured to the mechanical carrier rail structure by rotating the plurality of mechanical LED disc mounts about the mechanical carrier rail structure.

17. An interlocking connector for connecting a light-emitting diode (LED) assembly to a mechanical carrier rail structure, the interlocking connector comprising:
an LED disc mount having an interlocking screw assembly; and
an electrical connection assembly having an interlocking screw protrusion,
wherein the LED disc mount is configured to be mechanically secured to the mechanical carrier rail structure by rotating the interlocking screw assembly about the interlocking screw protrusion.

18. The interlocking connector of claim 17, wherein the electrical connection assembly comprises a plurality of connectors to communicatively couple the LED assembly to other LED assemblies from among a plurality of LED assemblies that are secured to the mechanical carrier rail structure.

19. The interlocking connector of claim 17, wherein the LED assembly is secured to the mechanical carrier rail structure by pushing in the LED assembly into the LED disc mount.

20. The interlocking connector of claim 17, wherein the mechanical carrier rail structure comprises a first opening,
wherein the LED disc mount comprises a second opening, and
wherein the electrical connection assembly is configured to slide through the first opening and the second opening to expose the interlocking screw protrusion.

* * * * *